United States Patent
Kawashima et al.

(10) Patent No.: US 6,805,282 B2
(45) Date of Patent: Oct. 19, 2004

(54) FLOW SOLDERING PROCESS AND APPARATUS

(75) Inventors: Yasuji Kawashima, Ibaraki (JP); Kenichiro Suetsugu, Nishinomiya (JP); Shunji Hibino, Hirakata (JP); Hiroaki Takano, Hirakata (JP); Tatsuo Okuji, Moriguchi (JP); Shoshi Kabashima, Hirakata (JP); Yukio Maeda, Hirakata (JP); Mikiya Nakata, Suita (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/148,014
(22) PCT Filed: Sep. 25, 2001
(86) PCT No.: PCT/JP01/08298
§ 371 (c)(1), (2), (4) Date: May 24, 2002
(87) PCT Pub. No.: WO02/28156
PCT Pub. Date: Apr. 4, 2002

(65) Prior Publication Data
US 2002/0179693 A1 Dec. 5, 2002

(30) Foreign Application Priority Data

Sep. 26, 2000 (JP) ........................................ 2000-292271
Sep. 29, 2000 (JP) ........................................ 2000-299423

(51) Int. Cl.$^7$ .......................... H05K 3/34; B23K 1/08; B23K 3/06
(52) U.S. Cl. ........................ 228/260; 228/233.2; 228/37
(58) Field of Search ............................ 228/233.2, 260, 228/256, 37, 33, 232.2

(56) References Cited

U.S. PATENT DOCUMENTS

| 4,446,358 A | 5/1984 | Comerford et al. |
| 4,538,757 A | 9/1985 | Bertiger |
| 4,600,137 A | 7/1986 | Comerford |
| 4,921,156 A | * 5/1990 | Hohnerlein ................... 228/37 |

(List continued on next page.)

FOREIGN PATENT DOCUMENTS

| EP | 0 269 822 | 6/1988 |
| EP | 0 938 944 | 9/1999 |
| EP | 1 162 021 | 12/2001 |
| EP | 1 188 506 | 3/2002 |
| JP | 63-174778 | 7/1988 |
| JP | 6-85442 | 3/1994 |
| JP | 8-242074 | 9/1996 |
| JP | 9-237964 | 9/1997 |
| JP | 09327791 A | * 12/1997 |
| JP | 9-327791 | 12/1997 |
| JP | 11-245030 | 9/1999 |
| JP | 2000-190073 | 7/2000 |
| JP | 2000-252620 | 9/2000 |
| JP | 2002-62273 | 2/2002 |
| JP | 2002-141658 | 5/2002 |

*Primary Examiner*—Kiley Stoner
*Assistant Examiner*—Kevin McHenry
(74) *Attorney, Agent, or Firm*—Wenderoth, Lind & Ponack, L.L.P.

(57) ABSTRACT

There is provided a flow soldering process for mounting an electronic component onto a board by a solder material, which process is appropriate for using a lead-free solder material as the solder material.

In the flow soldering process, thermal efficiency of flow soldering is improved in preheating step and/or solder material supplying step thereof. In one aspect of the present invention, a heating cover is located above a preheater, and the flow soldering is conducted while the board passes between the heating cover and the preheater. In another aspect of the present invention, a gap between a preheater and a solder bath is 20 to 60 mm. In yet another aspect of the present invention, a distance between a primary wave and a secondary wave is not larger than 60 mm.

8 Claims, 16 Drawing Sheets

U.S. PATENT DOCUMENTS

| | | | |
|---|---|---|---|
| 5,044,542 A | * | 9/1991 | Deambrosio .................. 228/37 |
| 5,121,874 A | * | 6/1992 | Deambrosio et al. ........ 228/219 |
| 5,203,489 A | * | 4/1993 | Gileta et al. ................. 228/219 |
| 5,228,614 A | * | 7/1993 | Elliott et al. ................... 228/37 |
| 5,230,460 A | * | 7/1993 | Deamborsio et al. .... 228/180.1 |
| 5,240,169 A | * | 8/1993 | Gileta ...................... 228/180.1 |
| 5,297,724 A | * | 3/1994 | Mehta et al. ................ 228/219 |
| 5,520,320 A | * | 5/1996 | McKean et al. ............ 228/102 |
| 5,630,542 A | * | 5/1997 | Hendrikx ...................... 228/37 |
| 5,685,475 A | * | 11/1997 | Jairazbhoy et al. ............ 228/37 |
| 5,769,305 A | * | 6/1998 | Takeda et al. ................. 228/37 |
| 5,772,101 A | * | 6/1998 | Nishimura et al. ........... 228/37 |
| 5,813,595 A | * | 9/1998 | Albrecht et al. ............ 228/200 |
| 6,164,516 A | * | 12/2000 | Watanabe et al. .............. 228/37 |
| 6,464,122 B1 | * | 10/2002 | Tadauchi et al. .............. 228/1.1 |

* cited by examiner

Fig.2
(a)
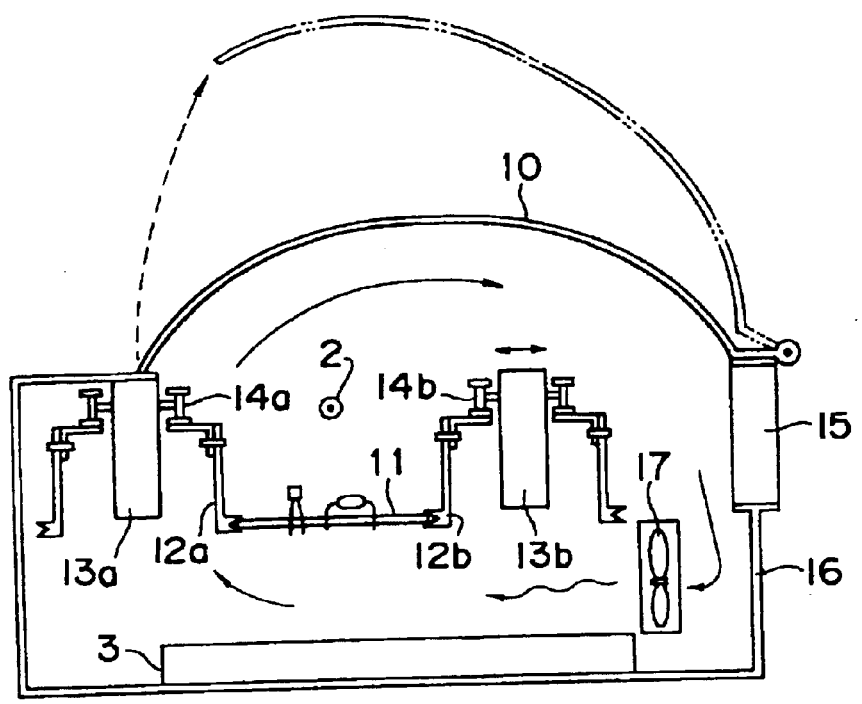
(b)
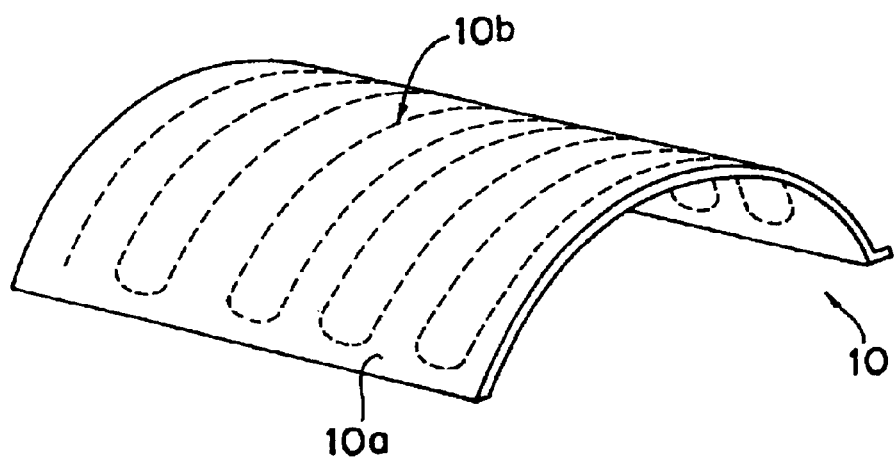

FLOW SOLDERING PROCESS AND APPARATUS

TECHNICAL FIELD

The present invention relates to a flow soldering process for mounting a component(s) such as an electronic component(s) onto a board (or substrate) by means of a solder material, and also relates to an apparatus for such process.

BACKGROUND ART

A flow soldering process utilizing a molten solder material in the form of a wave(s) has been conventionally known as one of processes for connecting an electronic component or the like to a board in the field of production of an electronic circuit board. Such flow soldering process generally includes a flux applying step for applying flux onto a board, a preheating step for heating the board in advance, and a solder material supplying step for supplying a solder material to the board by contacting the board with a wave(s) of the solder material. Hereinafter, the conventional flow soldering process will be described with reference to the drawings. FIG. 15 is a schematic side view of the conventional flow soldering apparatus while showing its internal construction. FIG. 16 is a schematic view of the flow soldering apparatus of FIG. 15 when viewing it from a cross section taken along an X'—X' line.

At first, a board is supplied with flux by a flux supplying means (not shown) while applying the flux onto a lower surface of the board. The board is, for example, a printed circuit board onto which an electronic component such as a "through hole insertion component (or an inserted component)" (i.e. a component a part of which is inserted into a through hole, for example, a discrete component or a lead component) is to be mounted at a predetermined position according to a known manner. The flux generally contains an active ingredient such as rosin (a resin component) as well as a solvent such as isopropyl alcohol. The flux applying step for applying such flux to the board is conducted in order to improve wettability and a spreading property of the solder material on a surface of a land formed on or through the board (i.e. a portion to be supplied with the solder material) by removing an oxide film (a naturally oxidized film) which is unavoidably formed on the land. As the flux supplying means (or device), a spray fluxer for spraying the flux in the form of mist to the board, a foam fluxer for contacting the board with the flux in the form of foam or the like can be used. These flux supplying means can be situated separately from a flow soldering apparatus 60 of FIG. 15, though the flux supplying means can form the flow soldering apparatus 60 by integrally incorporating the flux supplying means in the flow soldering apparatus 60.

The board 71 applied with the flux as described above is then fed into the flow soldering apparatus 60 shown in FIG. 15 through an inlet 61 thereof. The board 71 is mechanically conveyed in a direction of an arrow 62 (hereinafter referred to as a conveyance direction) inside the apparatus 60 (along the conveyance line shown as a broken line in FIG. 15) at a substantially constant speed. More specifically, the conveyance of the board 71 is conducted by holding the board 71 with conveyance fingers 72a and 72b at its both edge portions which locate on opposed right and left sides of the board when viewing the board towards the conveyance direction 62 as shown in FIG. 16 and by mechanically moving the conveyance fingers 72a and 72b in the conveyance direction of the arrow 62. The conveyance fingers 72a and 72b are connected to chains 74a and 74b respectively and run around conveyer frames 73a and 73b respectively in a plane parallel to a principal plane of the board 71. The conveyer frames 73a and 73b extend from the inlet 61 to an outlet 69 shown in FIG. 15. The conveyer frame 73a is a base conveyer frame which is fixed, and the conveyer frame 73b is a width adjustable conveyer frame which can slide in directions being perpendicular to the conveyance direction and able to keep parallel to the fixed conveyer frame 73a (in other words, which directions are shown as a left and right arrow in FIG. 16 and lateral in the sheet of FIG. 16).

The board 71 conveyed in the apparatus 60 from the inlet 61 toward the outlet 69 as described above is firstly heated by a preheater 63 locating under the conveyance line of the board, for example a far infrared heater. Such heating step is referred to as a preheating step. The preheating step is conducted for vaporizing and removing an unnecessary solvent ingredient in the flux applied onto the board 71 through the above described flux applying step so as to leave only the active ingredient on the board 71 and also for preheating the board 71 prior to supply of a solder material 64 to the board 71 so as to alleviate a heat shock of the board 71 upon contacting the board 71 with a molten solder material 64. The preheater 63 is located under the conveyance line by generally being put on a bottom of a channel structure (or support) 76 which is open on its upside and which is connected to the fixed conveyer frame 73a and a fixed frame 75 at its top portions. Thus, the preheater 63 heats the board 71 from a lower side of the board 71 which is the same side to which the solder material is supplied in the following solder material supplying step.

The board 71 is subsequently conveyed above a solder material supplying means (or unit) 66 which includes a solder bath 65. The solder bath 65 contains the solder material 64 which is in a molten state by heating beforehand. A distance "$d_1$" between the preheater 63 and the solder bath 65 (i.e. a distance along the conveyance direction between them) is generally about 70 to 150 mm. When the board 71 goes over the solder material supplying means 66, the board 71 is contacted at the lower surface of the board 71 with a primary wave 67 and a secondary wave 68 of the solder material 64, so that the solder material 64 is supplied to the board 71. As the solder waves 67 and 68 are shown in FIG. 17 while enlarging them, a distance "$d_2$" between the primary wave 67 and the secondary wave 68 (more specifically, a distance along the conveyance direction from a position at which a certain point of the board 71 leaves the primary wave to a position at which the certain point begins to contact with the secondary wave) is generally about 80 to 150 mm.

In this solder material supplying step, the solder material 64 which is supplied in the form of the primary wave 67 rises in an annular space between a land portion and a lead 74 of the through hole insertion component 73 from a lower side of the board 71 by the capillary phenomenon as shown in FIG. 18, wherein the land portion forms a wall of the through hole 72 perforated through the board 71 and the lead has been inserted through the through hole from an upper side of the board. An excess amount of the solder material 64 adhering to the lower surface to the board 71 by the primary wave is removed by subsequently contacting the solder material 64 in the form of the secondary wave 68 with the board 71. Then, the solder material which is supplied and adheres to the board 71 solidifies with a drop in its temperature and forms a so-called "fillet" as a connection portion of the solder material.

In such solder material supplying step (or flow soldering step), the primary wave 67 is directed for sufficiently wetting a surface of the land 75 which covers the wall of the through hole 72 (as well as wetting the lead 74 of the electronic component) with the solder material and for supplying the solder material into the through hole 72. If it is insufficient, the solder material does not rise up along the annular space between the lead 74 and the land portion which forms the wall of the through hole 72, so that there occurs a problem of a so-called "red eye (or non-wetting)" (which is referred to as "akame" in Japanese), for example. The "red eye" is, in other words, a phenomenon in which the land which is generally made of copper shows its color and the land is observed like as a red colored eye since an annular land portion locating on the upper surface of the board is not covered with the solder material but exposed, and the "red eye" may also be referred to as an "insufficient rising (or insufficient wetting up)" (shortage of the supply of the solder material to the through hole resulting from insufficient rising of the solder material by the capillary action). On the other hand, the secondary wave 68 is directed for removing an excess amount of the solder material which is adhering to an area of the lower surface of the board covered with a solder resist and also for conditioning the fillet form. If the removing and conditioning is unsatisfactory, the solder material remains on an area between lands and solidifies thereon to undesirably form a so-called "bridge" (such bridge is undesirable since it causes a short circuit) or a ceratoid projection.

The lead of the electronic component is electrically and physically connected to the land of the board by the fillet of the solder material as described above. The resultant board 71 is thereafter taken out through the outlet 69 (see, FIG. 15). Thus, an electronic circuit board is produced wherein the electronic component has been soldered to the board according to the flow soldering process.

For the electronic circuit board produced as described above, an Sn—Pb based solder material which contains Sn and Pb as main constituents (or components), especially an Sn—Pb eutectic solder material is commonly used. However, lead contained in such an Sn—Pb based solder material may cause environmental pollution if it is subjected to an inadequate waste treatment, so that a solder material containing no lead, i.e. a so-called lead-free solder material, has started to be used as an alternative of the solder material containing lead in an industrial scale.

However, when the flow soldering is conducted by utilizing the conventional process and apparatus just while substituting the lead-free solder material for the Sn—Pb based material, there arise a problem that an occurrence ratio of the so-called "red eye" (or "insufficient rising") or "bridge" is increased compared with using the Sn—Pb based material. Therefore, it is not necessarily appropriate in the case of using the lead-free solder material to utilize the conventional flow soldering process and apparatus just as they are.

SUMMARY OF THE INVENTION

The present invention is directed to solve the prior art problems as described above. The present invention aims to provide a flow soldering process for mounting an electronic component onto a board with a solder material, which is appropriate to a case of using a lead-free solder material as the solder material, and can alleviate and preferably solve at least a part of the problems as described above. The present invention also aims to provide an apparatus for performing such flow soldering process.

The inventors have found that one cause for the above problems resides in a higher melting point of the lead-free solder material compared with that of the Sn—Pb based material. Further, we also found that though the lead-free solder material generally has a higher melting point than that of the Sn—Pb based material, an operation temperature of the flow soldering using the lead-free solder material is not increased compared with an operation temperature of the conventional flow soldering using the Sn—Pb solder material by a certain extent which corresponds to the difference between the melting points of the lead-free solder material and the Sn—Pb based solder material.

As to the melting points of the general lead-free solder material, it is about 220° C. for an Sn—Ag—Cu based material, and about 227° C. for an Sn—Cu based material. These melting points are higher than that of the Sn—Pb eutectic solder material of 183° C. by about 30 to 50° C. On the other hand, the operation temperature of the flow soldering process using the lead-free solder material is about 250 to 255° C., and increased by only about 10 to 15° C. from the conventional operation temperature for the Sn—Pb based solder material of about 235 to 245° C. (The operation temperature as one measure in the present specification is a liquid temperature of the molten solder material in the solder bath.)

It can be considered that wettability of a molten metal material generally depends on a temperature difference on a basis of a melting temperature of the metal material (in other words, a temperature difference obtained by subtracting the melting temperature of the metal material from an actual temperature of the metal material in the molten state), and the wettability becomes lower as the temperature difference becomes smaller. Based on this consideration, the wettability of the lead-free solder material is seems to be lower than the wettability of the Sn—Pb solder material since the temperature difference by subtracting the melting temperature from the operation temperature in the case of using the lead-free solder material is smaller than when using the Sn—Pb based material.

By the way, the actual temperature of the solder material varies depending on the situation in which the solder material is located, and the actual temperature is highest when the solder material is in the molten state in the solder bath and thereafter decreases by contacting the solder material in the form of a solder wave with the board having a lower temperature thereby losing an amount of heat of the solder material through the board. Though the temperature decrease in the case of using the Sn—Pb based solder material would be to such an extent that a problem is not caused, the temperature decrease in the case of using the lead-free solder material will remarkably influence its wettability thereby to inhibit the molten lead-free solder material supplied by the form of the primary wave from sufficiently rising in an annular space between a lead and a land portion which forms a wall of a through hole and therefore causing the so-called "red eye".

Further in the case of using the lead-free solder material, it can be considered that the molten solder material supplied by the primary wave and adhering to the board loses an amount of its heat through the board and/or an ambient atmosphere before the board make contact with a fresh solder material by the secondary wave, and therefore decreases its temperature to partially solidify. Such a temperature decrease in the case of using the Sn—Pb based solder material does not cause a problem. In the case of using the lead-free solder material, however, the solder material will be sensitively influenced by a small temperature decrease during a period after leaving the primary wave of the board before contacting with the secondary wave, so that the solder material starts to solidify during this period. Since solder material has solidified during the period after leaving the primary wave before contacting with the secondary wave (in other words, while a certain point of the board passes through a distance "$d_2$" shown in FIG. 17), the solidified solder must be melted again by the secondary wave. If the solder material is not sufficiently melted by the secondary wave, this may causes a so-called "bridge" to be formed.

As described above, one cause of the problems of the "bridge", the "insufficient rising" and so on which may occur in the flow soldering process using the lead-free solder material resides the fact that the solder material supplied to the board decreases its temperature excessively relative to its high melting point by losing an amount of its heat through the board during the flow soldering process, especially in a solder material supplying step.

In order to eliminate such cause and avoid the occurrence of the "insufficient rising", the "bridge" and so on of the solder material resulting from the temperature decrease of the solder material upon soldering, it might be suggested to further increase the operation temperature of soldering in the case of using the lead-free solder material so as to make a temperature difference between the operation temperature and the melting temperature of the solder material similar to that in the conventional case which uses the Sn—Pb based solder material. However, it is impossible to further increase the operation temperature while using the conventional apparatus because of constraint of heat resistance as to the board, the components and so on.

Therefore, for the purpose of decreasing an occurrence ratio of the "insufficient rising", the "bridge" and so on, we have further studied suppressing the temperature decrease of the solder material in the solder material supplying step of the flow soldering process.

The temperature decrease of the solder material, as described above, seems to be caused by losing an amount of heat from the solder material (more specifically, the solder material supplied by the form of the primary wave) through the board and the ambient atmosphere surrounding the board. Thus, we have conceived that the occurrence ratio of the "insufficient rising", the "bridge" and so on which may be caused in the flow soldering using the lead-free solder material can be lowered, for example, by improving thermal efficiency in a preheating step before the solder material is supplied to the board so as to maintain a temperature of the board itself higher (or to suppress the temperature decrease of the board), or by suppressing the temperature decrease of the solder material which has been supplied to the board by the form of the primary wave.

On the basis of such knowledge, we have developed a flow soldering process improved by various approaches as well as an apparatus for such flow soldering process.

It is noted that the temperature of a board means a temperature of a lower surface of the board, more specifically a temperature of a land portion located on the lower surface (or a back side) of the board. Such temperature can be measured by, for example, contacting a thermocouple with the land portion located on the lower surface of the board (for example by bonding it to the land portion) and recording data obtained from the thermocouple. Thus, the temperature decrease of the board can be calculated based on the obtained data.

More specifically, there are provided various flow soldering processes and apparatuses as described below based on the present invention. According to those flow soldering processes and/or apparatus, the occurrence ratio of the "insufficient rising", the "bridge" and so on upon the flow soldering can be maintained at an extent which is not larger than that in the conventional case of using the Sn—Pb based solder material.

In one aspect of the present invention, there is provided a flow soldering process for mounting an electronic component onto a board by means of a solder material, which process includes: a preheating step for previously heating the board, which is provided with the electronic component and conveyed, by using a preheater locating under the board and a heating cover extending over the board; and a solder material supplying step for supplying the solder material in a molten state to the board by contacting the solder material as a primary wave and a successive secondary wave with a lower surface of the board. It is noted that a device (or heater) is herein referred to as the preheater, which device previously heats the board prior to the solder material supplying step by heating the board from its lower side while locating under the board as in the conventional apparatus.

In another aspect of the present invention, there is provided a flow soldering apparatus for mounting an electronic component onto a board by means of a solder material, which apparatus includes: a preheater locating under the board which is provided with the electronic component and conveyed; a heating cover locating above the preheater so as to extend over (or cover the above of) the board; and a solder material supplying means (or unit or device) for supplying the solder material in a molten state to the board by contacting the solder material as a primary wave and a successive secondary wave with a lower surface of the board, the means locating downstream of the preheater in a direction of conveyance of the board.

In the preheating step prior to the solder material supplying step in the conventional process as shown in FIGS. 15 and 16, heating of the board 71 by the preheater 63 such as a far infrared heater locating under the conveyance line of the board 71 was conducted in such a condition that a preheating zone which is a part of a conveyance space (that is, a space through which the board 71 is conveyed) and which locates above the preheater 63 (wherein such preheating zone is also a space inside the channel structure 76 (see, FIG. 16)) is not substantially isolated form a space outside the channel structure 76 and communicated with this space through an opening at a top of the channel structure 76. The board 71 is exposed to a preheating atmosphere gas which is formed by heating an atmosphere gas in the preheating zone by the preheater 63. In this process, however, an amount of heat of the preheating atmosphere gas escapes and scatters into an ambient gas outside the channel structure 76 having a temperature lower than that of the preheating atmosphere gas.

According to the process or an apparatus of the present invention, on the other hand, the preheater locating under the board (or the conveyance space or the conveyance line of the board) and the heating cover extending over the board (or closing a top of the conveyance space or above the conveyance line of the board) are used, so that the preheating atmosphere gas in the preheating zone between the preheater and the heating cover is isolated from the ambient gas outside the preheating zone having the lower temperature to suppress heat dissipation of the preheating atmosphere gas, which results in improved thermal efficiency. Thus, the board can be heated to a higher temperature because of the higher thermal efficiency according to the process or the apparatus of the present invention described above even when an amount of heat supply is equal to that in the conventional process.

Furthermore, the "heating cover" used for the process or the apparatus of the present invention as described above has a function of heat generation for heating in addition to the function as the cover for isolating the preheating atmosphere gas to some extent as described above. Therefore, it is possible to heat the board not only from its lower side by means of the preheater but also from its upper side by means of the heating cover (or a heat generation cover) having the function to emit heat. Thus, the board can be heated to a temperature further higher than that in the conventional process using only the preheater.

As a results of these, it is possible to heat the board in the preheating step to the temperature higher than in the conventional case and in turn to transfer the board having the higher temperature to the following solder material supplying step, and therefore to keep a temperature of the board higher at the beginning of the solder material supplying step.

It is noted that the heating cover described above preferably rises the temperature of the board positively, but it may generate a heat to such an extent that decrease in the temperature of the board can be prevented compared with a case without the heating cover. In the heating cover, a heat generation body having the function to emit heat (or a heater) and a cover body may not be integral to form a single body. Preferably, the heating cover described above (more specifically the heat generation body which constitutes the heating cover) is composed of plural sections (which are preferably located along the conveyance direction), and heating of each section as to heating using such heating cover is controlled.

In a preferred embodiment, the heating cover described above extends not only above the preheater but also above the solder material supplying means so as to cover the board. As shown in FIG. 15, a solder material supplying zone which is a part of the conveyance space for the board 71 and located above the solder material supplying unit 66 (more specifically, above the solder material 64 in the solder bath 65) is not covered by a cover and is communicated with its surrounding space, so that a heat radiated from the molten solder material and so on escapes and scatters into an atmosphere gas in the surrounding space having a lower temperature. On the other hand, since the heating cover extending over both of the preheater and the solder material supplying unit is provided as in this preferred embodiment of the present invention, not only the preheating atmosphere gas in the preheating zone but also the atmosphere gas in the solder material supplying zone between the heating cover and the solder material supplying unit (more specifically, the solder material in the solder bath) can be isolated from the atmosphere gas surrounding them and having the lower temperature. Thus, the heat dissipation from the solder material supplying zone can be suppressed and therefore the thermal efficiency can be further improved. Thus, the temperature of the board can be kept higher. In this embodiment, the heating cover preferably heats the board in the solder material supplying step (or in the solder material supplying zone) in addition to the preheating step (or in the preheating zone), wherein the phrase "heats the board" includes prevention of the temperature decrease of the board.

In a preferred embodiment, an apparatus of the present invention further includes a forced convection generating means (or device) for forcedly convecting (or mixing) the preheating atmosphere gas in the preheating zone between the heating cover and the preheater. According to this embodiment of the present invention, since the preheating atmosphere gas heated by the preheater and the heating cover is forcedly convected in the preheating zone, a temperature of the preheating atmosphere gas can be made uniformly, and the thermal efficiency of the preheating zone as a whole can be further improved, and the temperature of the board can be made further higher.

As the forced convection generating means, for example, a fan or a gas blowing means (or device) can be used. The fan can circulate the preheating atmosphere gas in the preheating zone. As the gas blowing means, a compressor can be used which blows a gas such as an air and preferably nitrogen gas having a temperature of, for example, about 200 to 400° C. and supplies it into the preheating zone. When the gas blowing means is used, it is preferable to supply the gas (e.g. gas having a temperature higher than that of the atmosphere gas in the preheating zone) into the preheating zone while suctioning the atmosphere gas in the preheating zone.

According to another aspect of the present invention, there is provided a flow soldering process for mounting an electronic component onto a board by means of a solder material, which process includes: a preheating step for previously heating the board, which is provided with the electronic component and conveyed, by using a preheater locating under the board; and a solder material supplying step for supplying the solder material in its molten state to the board by contacting the solder material as a primary wave and a secondary wave successively with a lower surface of the board which has been previously heated, wherein a temperature decrease of the board during a period after having previously been heated in the preheating step before contacting with the primary wave is not larger than 3° C.

The temperature decrease of the board after during a period after the board has been heated by the preheater (and a heating cover as described above in case) in the preheating step (that is, after the board has passed a position which is just above a downstream end of the preheater) and before the board comes in contact with the primary wave by the solder material supplying means in the solder material supplying step is generally not greater than about 3° C. and preferably not greater than about 2° C. according to a process of the present invention described above, though it is about 5 to 20° C. in the conventional process. Since the temperature decrease of the board until the board contacts with the primary wave is made smaller, the temperature of the board at the beginning of the solder material supplying step becomes higher.

More concretely, the temperature decrease of the board can be made 3° C. or smaller by setting a gap at 20 to 60 mm between the preheater for previously heating the board (more specifically, the downstream end of the preheater) and a solder bath which contains the solder material in the molten state and forms the primary wave and the secondary wave which contact with the lower surface of the board (more specifically, an upstream end of the solder bath).

Thus, according to other aspect of the present invention, there is provided a flow soldering apparatus for mounting an electronic component onto a board by means of a solder material, which apparatus includes: a preheater locating under the board which is provided with the electronic component and conveyed; and a solder material supplying means for supplying the solder material in its molten state contained in a solder bath to the board by contacting the solder material as a primary wave and a secondary wave successively with a lower surface of the board, wherein the unit locating downstream from the preheater in a direction of conveyance of the board is constructed to have a gap between the preheater and the solder bath within 20 to 60 mm.

The gap between the preheater and the solder bath is conventionally about 100 mm or more. Since the gap in an apparatus of the present invention is made narrower than that in the conventional apparatus, a time required for the board to pass the gap is shortened, and the temperature decrease of the board is lowered when it is conveyed above the gap, and therefore the temperature of the board at the beginning of the solder material supplying step can be made higher. It is noted that the gap having a width of at least about 20 mm is required to prevent an accident of a short circuit in the preheater.

In a preferred embodiment, the apparatus of the present invention described above is provided with a closing means (or device or element) for closing the gap between the preheater and the solder bath to obstruct a stream of an atmosphere gas passing through the gap.

In the conventional apparatus, since there is generally a gap between the preheater and the solder bath in order to prevent an accident of a short circuit as described above while sucking an atmosphere gas in a space through which the board was conveyed and passed (also, referred to as a "conveyance space") into an exhaust duct locating above the board so as to discharge it out in order to remove smoke outside which generates upon vaporization of the flux, an atmosphere gas having a temperature lower than that of the atmosphere gas in the conveyance space of the board flows into through the gap between the preheater and the solder bath upwardly from downside of the gap and entered into the conveyance space locating above the gap from outside of the conveyance space. As a result, a temperature of the board was directly decreased by contacting the atmosphere gas having the lower temperature with the board to carry an amount of heat away from the board, or indirectly decreased by carrying away an amount of heat away from the atmosphere gas in the preheating zone and/or in the solder material supplying zone, in which the preheating zone and the solder material supplying zone are located upstream and downstream of the gap, respectively. However, according to this embodiment of the present invention, since a stream of such atmosphere gas having the lower temperature is obstructed by the closing means (or closure) for closing the gap, the temperature decrease of the board during passing of the board through a space above the gap is further reduced and the temperature of the board at the beginning of the solder material supplying step can be made higher.

In yet another aspect of the present invention, there is provided a flow soldering process for mounting an electronic component onto a board by means of a solder material, which process includes: a preheating step for previously heating the board, which is provided with the electronic component and conveyed, by using a preheater locating under the board; and a solder material supplying step for supplying the solder material in its molten state to the board by contacting the solder material as a primary wave and a secondary wave successively with a lower surface of the board, while an atmosphere gas in a space above the solder material in the molten state is thermally isolated from a gas which is downstream from the atmosphere gas in a direction of conveyance of the board and has a temperature lower than that of the atmosphere gas.

In yet another aspect of the present invention, there is provided a flow soldering apparatus for mounting an electronic component onto a board by means of a solder material, which apparatus includes: a preheater locating under the board which is provided with the electronic component and conveyed; a solder material supplying unit for supplying the solder material in its molten state to the board by contacting the solder material as a primary wave and a secondary wave successively with a lower surface of the board, the unit locating downstream from the preheater in a direction of conveyance of the board; and an isolation means (or device) for thermally isolating an atmosphere gas in a space above the solder material supplying unit from a gas which is present downstream of the atmosphere gas in a direction of conveyance of the board and has a temperature lower than that of the atmosphere gas.

Generally, an atmosphere gas in the solder material supplying zone is heated by the solder material used in the solder material supplying step and having a high temperature (as well as by the preheater used in the preheating step) to a high temperature. According to the process or the apparatus of the present invention as described above, since such an atmosphere gas in the solder material supplying zone having a relatively high temperature is thermally isolated from an atmosphere gas which locates downstream of the solder material supplying zone in a direction of the conveyance of the board and which has a temperature lower than that of the atmosphere gas in the solder material supplying zone, dissipation of heat of the atmosphere gas in the solder material supplying zone is effectively alleviated. Thus, in the solder material supplying step, the board can be exposed to an atmosphere gas having a higher temperature, and a temperature of the board can be made higher.

In a preferred embodiment, the isolation means as described above is an air curtain or a mechanical shutter.

The air curtain is formed by flowing a gas (preferably a gas having a high temperature) across the conveyance space (or the conveyance line) of the board. Though air, nitrogen gas or the like can be used as such gas, the nitrogen gas is preferable. The nitrogen gas has an advantage in that it induces no oxidation of the solder material and/or the land formed in the board and can further improve a wettability of the solder material.

As the mechanical shutter, a shutter which is made of a heat resistant material such as a stainless steel, a rubber or the like and which is mechanically operable to open and close can be used. Such a shutter can be operated such that the shutter in a closed condition will open when the board is conveyed and approaches to the closed shutter and the shutter closes again after the board is passed through the open shutter.

In yet another aspect of the present invention, there is provided a flow soldering process for mounting an electronic component onto a board by means of a solder material characterized in that, in a solder material supplying step for supplying the solder material in its molten state to the board which is provided with the electronic component on its upper surface by contacting the solder material as a primary wave and a secondary wave successively with a lower surface of the board, a gas having a high temperature, preferably a temperature of 200 to 400° C. and more preferably of 220 to 280° C., is blown toward the upper surface of the board when the board is on the primary wave.

According to this process of the present invention, since the gas having the high temperature is blown toward the upper surface of the board when the board locates on the primary wave, the temperature decrease of the solder material is suppressed upon rising of the solder material supplied to the board. In a case, since the solder material is heated uniformly, it is possible to assure the wettability of the solder material sufficient to rise along the through hole formed through the board. Thus, the occurrence ratio of the "insufficient rising", the "bridge" and so on can be reduced effectively. The phrase "on the primary wave" in the present specification means on a zone where the board contacts with the primary wave with respect to a flow direction of the primary wave toward the board and the zone may further include an area shifted upstream or downstream in the conveyance direction with respect to a cross section which includes the conveyance direction of the board (for example, on the secondary wave).

The gas described above may be blown toward the upper surface of the bard at any appropriate angle, for example from right above or obliquely above with respect to the board. In a preferred embodiment, the gas is blown toward it at an angle of −60 to +60 degrees with respect to a direction right to the upper surface of the board in a cross section containing the conveyance direction of the board. In such a case, a protrusion formed with the solder material which rises through the through hole and protrudes from the upper surface of the board can be flattened out over the upper surface of the board (preferably on a land) by a pressure of the blown gas. As a result, the solder material is likely to spread over the upper surface of the board.

It is noted that a value of the "angle" in the specification is based on a direction which is upwardly perpendicular to the upper surface of the board in the cross section containing the conveyance direction for conveying the board (that is, such upwardly perpendicular direction defines an angle of zero degree), and the angle value is expressed with "+" sign when the angle is inclined toward upstream in the conveyance direction of the board and expressed with "−" sign when the angle is inclined toward downstream in the conveyance direction of the board with respect to the based direction.

Though air, nitrogen gas or the like can be used as the gas blown toward the board, nitrogen gas is preferable. Nitrogen gas has an advantage in that it induces no oxidation of the solder material and/or the land formed on the board and can further improve the wettability of the solder material. Additionally, it is preferable to use a gas which has been heated prior to being blown toward the board, though normal air (i.e. having a normal temperature) can also be used. In the case in which the air having a normal temperature is used, since such air is blown toward the board while involving the atmosphere gas around the board for heating, the gas having a substantially higher temperature is blown toward the board.

In a preferred embodiment, a sensor detects the presence of the board, and the blow of the gas is controlled depending on a detected result of the sensor so as to blow the gas when the board locates on the primary wave. In such embodiment, for example, when a plurality of the boards are conveyed intermittently, it is possible to reduce an amount of the gas blown toward the board and thereby to reduce power needed to blow the gas.

In another preferred embodiment of the present invention, there is provided a flow soldering apparatus for mounting an electronic component onto a board by means of a solder material, which apparatus includes: a solder material supplying unit for supplying the solder material in its molten state to the board, which is provided with an electronic component on its upper surface, by contacting the solder material as a primary wave and a secondary wave successively with a lower surface of the board; and a blowing means (or device) for blowing a gas, preferably nitrogen gas having a high temperature, preferably 200 to 400° C. and more preferably 220 to 280° C. toward the upper surface of the board when the board locates on the primary wave. In a preferred embodiment, the blowing means blows the gas toward the upper surface of the board at an angle of −60 to +60 degrees, preferably 0 to +60 degrees, with respect to a direction right to the upper surface of the board in a cross section containing the conveyance direction of the board. The apparatus also includes: a sensor for detecting the presence of the board; and a controller for the blowing device to blow the gas when the board locates on the primary wave.

In other aspect of the present invention, there is provided a flow soldering process for mounting an electronic component onto a board by means of a solder material characterized in that in a solder material supplying step for supplying the solder material in its molten state to the board, which is provided with the electronic component on the upper surface, by contacting the solder material as a primary wave and a secondary wave successively with a lower surface of the board, and that the primary wave and the secondary wave contact with the board while a distance "$d_2$" between the primary wave and the secondary wave is not larger than 60 mm and preferably about 30 to 50 mm and more preferably about 40 mm. The phrase "distance between the primary wave and the secondary wave" in the specification means a distance along which the board is carried after the board in contact with the primary wave leaves the primary wave and before the board comes to contact with the secondary wave.

Conventionally, the distance "$d_2$" between the primary wave and the secondary wave is generally about 80 to 150 mm as shown in FIG. 17. On the other hand, since the primary wave and the secondary wave are set closer to the each other at a distance of 60 mm or less as in the present invention, the temperature decrease during the period after the board leaves the primary wave and before the board comes to contact with the secondary wave can be effectively reduced. Therefore, it can be effectively suppressed that the solder material supplied in the form of the primary wave to the board and adhered thereto in the molten state solidifies before a fresh solder material is supplied to the board in the form of the secondary wave. As a result, it is possible to effectively reduce the occurrence ratios of the "insufficient rising", the "bridge" or the like when the lead-free solder material is used. Further, it is also possible to reduce an amount of heat energy required to melt the solidified solder material once again by the secondary wave.

It is also possible to reduce the temperature decrease of the board during the period after leaving the primary wave and before contacting with the secondary wave to not larger than 50° C. and preferably not larger than 30° C., for example, by blowing the gas having the high temperature toward the board by reducing the heat dissipation of the atmosphere gas in the space locating above the solder bath so as to keep the temperature of the gas, and/or by preheating the board more effectively in the preheating step as described above, in addition to by decreasing the distance between the primary wave and the secondary wave.

In a preferred embodiment of the process of the present invention as described above, dross which stays between the primary wave and the secondary wave is mechanically discharged as a dross containing material (i.e. as a mixture of the dross and the solder material) between the primary wave and the secondary wave. In a more preferred embodiment, a vegetable oil containing material is added to the dross containing material which is discharged from between the primary wave and the secondary wave so as to separate the solder material at least partially from the dross containing material.

Generally, the dross which is an oxide produced through oxidation of the solder material floats on the surface of the molten solder material. Usually, the dross is periodically removed in the form of the dross containing material which contains the dross and the solder material since the dross causes quality degradation of a soldering part (fillet) and insufficient soldering. In the case of using the lead-free solder material, such dross is produced in an amount larger than that in the case of using the Sn—Pb based solder material. When as in the present invention, the primary wave and the secondary wave are located closer to each other than in the conventional apparatus, the dross is likely to accumulate between the primary wave and the secondary wave and may occasionally climb up the surface of the wave countercurrently from between the primary wave and the secondary wave toward the top of the wave and adhere to the board. It is concerned that this may badly influence soldering. Thus, when the primary wave and the secondary wave are located closer to each other than the conventional apparatus according to the present invention, it is preferable to mechanically discharge the dross which stays between the primary wave and the secondary wave from between the primary wave and the secondary wave as the dross containing material. Such mechanical (or forced) discharge may be conducted successively while the flow soldering process is conducted, or intermittently at an interval between the flow soldering process and a next flow soldering process.

Though it is desirable to isolate the dross alone, the dross is generally removed in the form of the dross containing material which is a mixture of the dross and the solder material as described above, and as a result, the solder material as a useful component is wasted together with the dross. It has been known that the solder material can be recovered by adding the vegetable oil to the dross containing material to separate and recover the solder material at least partially from the dross containing material for the purpose of reducing a loss as the wasted solder material. As to a material containing the vegetable oil as a separating agent which can separate the solder material from the dross containing material, for example, Japanese Patent Kokai Publication Nos. H11-245030 and 2000-190073 describe using any one of saccharides, cereal grains or flours, bean flours, seed grains or flours, soybean-cake flours, and peanut hull flours, a combination thereof and the like. It is preferable also in the present invention to separate the solder material from the dross containing material at least partially by adding such separating agent to the dross containing material, and thereby to recover the useful solder material. It is noted that the contents of those two publications are incorporated herein by the reference thereto in their entireties.

In other aspect of the present invention, there is provided a flow soldering apparatus for mounting an electronic component onto a board by means of a solder material, characterized in that the apparatus includes a solder material supplying unit for supplying the solder material in its molten state to the board, which is provided with the electronic component on its upper surface, by contacting the solder material as a primary wave and a secondary wave successively with a lower surface of the board, and that a distance between the primary wave and the secondary wave is not larger than 60 mm. The apparatus of the present invention preferably includes a discharging means (or device) for mechanically discharging dross which exists between the primary wave and the secondary wave as a dross containing material from a position between the primary wave and the secondary wave. More preferably, the apparatus further includes means (or unit or device) for adding a material which contains a vegetable oil to the dross containing material which is discharged from between the primary wave and the secondary wave so as to separate the solder material at least partially from the dross containing material.

Additionally, the present inventors have made extensive studies and found a temperature profile which is suitable to conduct the flow soldering using the lead-free solder material. According to the temperature profile obtained by us, the board which has been heated (or preheated) to 120° C.±30° C. (i.e. 90 to 150° C.) of the temperature of the board (more specifically, the temperature of a land surface located on a lower surface of the board) is contacted with the primary wave at first. Next, the temperature of the board is maintained at not less than 200° C. during a period from leaving the primary wave of the board to contacting with the secondary wave of the board. Then, the board is cooled such that the temperature of the board is 150° C.±30° C. (i.e. 120 to 180° C.) at a point in time which is "10 seconds" later from a point in time at which the board leaves the secondary wave.

Such temperature profile can be established by any appropriate manner. The temperature ranges of the board in respective steps as described above can be realized by a manner for example as follows. The temperature of the board to be contacted with the primary wave can be made in the range of 120° C.±30° C. by controlling the temperature of the preheater and/or by increasing the efficiency of preheating compared with that in the conventional case. The temperature of the board during the period from leaving the primary wave to beginning to contact with the secondary wave can be maintained not less than 200° C. by setting a distance between the primary wave and the secondary wave smaller than in the conventional case, for example by setting the distance at about 60 mm or less. The temperature of the board after the board leaves the secondary wave is lowered by positively cooling the board by means of any appropriate cooling means (or device) such as a nozzle, an atomizer or the like which contacts a gas, a liquid or a mixture thereof with the board so as to cool the board. Thus, the temperature of the board can be 150° C.±30° C. at a point in time which is 10 seconds later from the point in time at which the board leaves the secondary wave.

By keeping and controlling the temperature profile of the board so as to satisfying those requirements as described above in the flow soldering process, it is possible to effectively reduce the occurrence ratios of the "insufficient rising" (or the generation of the "red eye"), the generation of the "bridge", and the so-called "lift-off" (that is, a phenomenon in which an edge of a fillet is lifted off a land portion which fillet is located on an upper and/or lower surface of the board and contacted with the fillet). This will be described later on more particularly.

The temperature profile described above is appropriate to conduct the flow soldering while selecting a conveyance speed of the board of, for example, about 1 to 2 m/min. (or about 1.6 to 3.3 cm/sec.). When the board is conveyed at a speed in such range, a period from leaving the primary wave of the board to contacting with the secondary wave of the board can be, for example, 3 to 5 seconds. When the conveyance speed of the board is out of such range, it can be readily understood by those skilled in the art that the point in time which is "10 seconds" later from the point in time at which the board leaves the secondary wave may be shifted appropriately depending on the conveyance speed.

The flow soldering processes and the apparatuses for the processes of the present invention are described above which are improved with various approaches. One of features of those flow soldering processes and the apparatuses of the present invention can be effective when it is used solely, but two or more features are preferably used in combination. These features can be selected in any combination.

Any of these flow soldering processes and apparatuses of the present invention is suitable for a case which uses a lead-free solder material such as an Sn—Cu based material, an Sn—Ag—Cu based material, an Sn—Ag based material, an Sn—Ag—Bi based material, an Sn—Ag—Bi—Cu based material and the like as the solder material. However, the present invention is not limited to such, and a lead-containing solder material such as an Sn—Pb based material can also be used.

As the board applicable to the present invention, it is possible to use, for example, a substrate of a paper phenol based material, a glass-epoxy based material, a polyimide film based material, a ceramic based material or other material. On the other hand, the electronic component which is connected (or soldered) to the board can be a through hole insertion component (e.g. a semiconductor, a capacitor, a resistor, a coil, a connector and so on) and/or a surface mount component located on a back surface of the board (e.g. a semiconductor, a capacitor, a resistor, a coil and so on). However, these are merely mentioned for a exemplary purpose, and should not be interpreted as any limitation of the present invention.

The flow soldering process of the present invention is preferably includes a flux applying step using a flux applying means (or unit or device), and the flow soldering apparatus of the present invention preferably includes the flux applying means. As the flux applying means, it is possible to use any one alone or in combination of a foaming mode flux applying means for contacting foamed flux with the board (e.g. a foam fluxer) and a spraying mode flux applying means for spraying atomized flux toward the board (e.g. a spray fluxer). For instance, the flux can be applied onto the board by means of the spraying mode means and thereafter by the foaming mode means or vice versa. The flux applying means can be incorporated to integrally constitute the flow soldering apparatus or separately located from the flow soldering apparatus.

Though the flow soldering processes and the apparatuses according to the present invention have been particularly described in the above, the present invention generally includes Modes 1 to 39 as follows:

(Mode 1)

A flow soldering process for mounting an electronic component onto a board by means of a solder material comprising:

a preheating step for previously heating the board by using a preheater locating under the board and a heating cover extending over (or covering the above of) the board, the board being provided with the electronic component and conveyed; and a solder material supplying step for supplying the solder material in its molten state to the board by contacting the solder material as a primary wave and a secondary wave successively with a lower surface of the board.

(Mode 2)

A flow soldering process for mounting an electronic component onto a board by means of a solder material comprising:

a preheating step for previously heating the board by using a preheater locating under the board, the board being provided with the electronic component and conveyed; and a solder material supplying step for supplying the solder material in its molten state to the board by contacting the solder material as a primary wave and a secondary wave successively with a lower surface of the board which has been previously heated, wherein a temperature decrease of the board during a period after being previously heated in the preheating step before contacting with the primary wave is not larger than 3° C.

(Mode 3)

A flow soldering process for mounting an electronic component onto a board by means of a solder material comprising:

a preheating step for previously heating the board by using a preheater locating under the board, the board being provided with the electronic component and conveyed; and a solder material supplying step for supplying the solder material in its molten state to the board by contacting the solder material as a primary wave and a secondary wave successively with a lower surface of the board while an atmosphere gas above the solder material in the molten state is thermally isolated from a gas which is downstream of the atmosphere gas in a direction of conveyance of the board and has a temperature lower than that of the atmosphere gas.

(Mode 4)

The process according to Mode 3, wherein a heating cover extending over the board is further used for previously heating the board in the preheating step.

(Mode 5)

The process according to any one of Modes 1, 3 and 4, wherein the solder material supplying step comprises having a temperature decrease of the board during a period after being previously heated in the preheating step before contacting with the primary wave not larger than 3° C.

(Mode 6)

The process according to any one of Modes 1 to 5, wherein a temperature decrease of the board during a period after leaving the primary wave of the board before contacting with the secondary wave of the board is not larger than 50° C.

(Mode 7)

The process according to any one of Modes 1 to 6, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

(Mode 8)

A flow soldering apparatus for mounting an electronic component onto a board by means of a solder material comprising:

a preheater locating under the board which is provided with the electronic component and conveyed;

a heating cover locating above the preheater so as to extend over (or cover the above of) the board; and a solder material supplying means for supplying the solder material in its molten state to the board by contacting the solder material as a primary wave and secondary wave successively with a lower surface of the board, the means locating downstream of the preheater in a direction of conveyance of the board.

(Mode 9)

A flow soldering apparatus for mounting an electronic component onto a board by means of a solder material comprising:

a preheater locating under the board which is provided with the electronic component and conveyed; and a solder material supplying means for supplying to the board the solder material in its molten state contained in a solder bath by contacting the solder material as a primary wave and a secondary wave successively with a lower surface of the board, the means locating downstream of the preheater in a direction of conveyance of the board and being constructed to set a width of a gap between the preheater and the solder bath within 20 to 60 mm.

(Mode 10)

A flow soldering apparatus for mounting an electronic component onto a board by means of a solder material comprising:

a preheater locating under the board which is provided with the electronic component and conveyed;

a solder material supplying means for supplying the solder material in its molten state to the board by contacting the solder material as a primary wave and a secondary wave successively with a lower surface of the board, the means locating downstream of the preheater in a direction of conveyance of the board; and an isolation means for thermally isolating an atmosphere gas above the solder material supplying means from a gas which is downstream of the atmosphere gas in a direction of conveyance of the board and has a temperature lower than that of the atmosphere gas.

(Mode 11)

The apparatus according to Mode 10 wherein the isolation means is an air curtain or a mechanical shutter.

(Mode 12)

The apparatus according to Mode 10 or 11, further comprising a heating cover locating above the preheater to extend over (or cover the above of) the board.

(Mode 13)

The apparatus according to Mode 8 or 12, wherein the heating cover extends over also the solder material supplying means so as to cover the above of the board.

(Mode 14)

The apparatus according to any one of Modes 8, 12 and 13, wherein the heating cover is composed of plural sections and each of the sections is controlled for heating with the heating cover.

(Mode 15)

The apparatus according to any one of Modes 8 and 12 to 14, further comprising a forced convection generating means for forcedly convecting an atmosphere gas in a space between the heating cover and the preheater.

(Mode 16)

The apparatus according to Mode 15, wherein the forced convection generating means is a fan or a gas blowing means.

(Mode 17)

The apparatus according to any one of Modes 8 and 10 to 16, wherein the solder material supplying means comprises a solder bath which contains the solder material in the molten state, and wherein a width of a gap between the preheater and the solder bath is within 20 to 60 mm.

(Mode 18)

The apparatus according to Mode 9 or 17, further comprising a closing means for closing the gap between the preheater and the solder bath so as to prevent a gas stream from passing through the gap.

(Mode 19)

The apparatus according to any one of Modes 8 to 18, wherein the solder material supplying means is constructed to set a distance between the primary wave and the secondary wave which contacts with the board not larger than 60 mm.

(Mode 20)

The apparatus according to any one of Modes 8 to 19, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

(Mode 21)

A flow soldering process for mounting an electronic component onto a board by means of a solder material characterized in that in a solder material supplying step for supplying the solder material in its molten state to the board by contacting the solder material as a primary wave and a secondary wave successively with a lower surface of the board, the board being provided with the electronic component on the upper surface, and that a gas having a high temperature is blown toward the upper surface of the board when the board is on a primary wave.

(Mode 22)

The process according to Mode 21, wherein the gas has a temperature of 200 to 400° C.

(Mode 23)

The process according to Mode 21 or 22, wherein the gas is blown toward the upper surface of the board at an angle of −60 to +60 degrees from a direction right to the upper surface of the board in a cross section which contains a direction of conveyance of the board.

(Mode 24)

The process according to any one of Modes 21 to 23, wherein the gas is nitrogen gas.

(Mode 25)

The process according to any one of Modes 21 to 24, which comprises detecting the presence of the board by a sensor and controlling the blow of the gas depending on a detected result of the sensor so as to blow the gas when the board is located on the primary wave.

(Mode 26)

A flow soldering apparatus for mounting an electronic component onto a board by means of a solder material comprising:

a solder material supplying means for supplying the solder material in its molten state to the board by contacting the solder material as a primary wave and a secondary wave successively with a lower surface of the board, the board being provided with the electronic component on its upper surface; and a blowing means for blowing a gas having a high temperature toward the upper surface of the board when the board is located on the primary wave.

(Mode 27)

The apparatus according to Mode 26, wherein the gas has a temperature of 200 to 400° C.

(Mode 28)

The apparatus according to Mode 26 or 27, wherein the blowing means blows the gas toward the upper surface of the board at an angle of −60 to +60 degrees from a direction right to the upper surface of the board in a cross section which contains a direction of conveyance of the board.

(Mode 29)

The apparatus according to any one of Modes 26 to 28, wherein the gas is nitrogen gas.

(Mode 30)

The apparatus according to any one of Modes 26 to 29, further comprising:

a sensor for detecting the presence of the board; and a controller for controlling the blowing means to blow the gas when the board is located on the primary wave.

(Mode 31)

A flow soldering process for mounting an electronic component onto a board by means of a solder material characterized in that in a solder material supplying step for supplying the solder material in its molten state to the board by contacting the solder material as a primary wave and a secondary wave successively with a lower surface of the board, the board being provided with the electronic component on the upper surface, and that the primary wave and the secondary wave contact with the board so as to set a distance between the primary wave and the secondary wave not larger than 60 mm.

(Mode 32)

The process according to Mode 31, wherein dross which exists between the primary wave and the secondary wave is mechanically discharged as a dross containing material from between the primary wave and the secondary wave.

(Mode 33)

The process according to Mode 32, wherein a vegetable oil containing material is added to the dross containing material which is discharged from between the primary wave and the secondary wave to at least partially separate the solder material from the dross containing material.

(Mode 34)

A flow soldering apparatus for mounting an electronic component onto a board by means of a solder material comprising a solder material supplying means for supplying the solder material in its molten state to the board by contacting the solder material as a primary wave and a secondary wave successively with a lower surface of the board, the board being provided with the electronic component on its upper surface, characterized in that a distance between the primary wave and the secondary wave is not larger than 60 mm.

(Mode 35)

The apparatus according to Mode 34, comprising a discharging means for mechanically discharging dross which exists between the primary wave and the secondary wave as a dross containing material from between the primary wave and the secondary wave.

(Mode 36)

The apparatus according to Mode 35, further comprising a means for adding a vegetable oil containing material to the dross containing material which is discharged from between the primary wave and the secondary wave to at least partially separate the solder material from the dross containing material.

(Mode 37)

A flow soldering process comprising contacting a solder material as a primary wave and a secondary wave successively with a lower surface of a board which is provided with an electronic component on its upper surface, characterized by:

contacting the board with the primary wave, wherein the board has been previously heated so as to have a temperature of the board of 90 to 150° C.;

maintaining the temperature of the board not less than 200° C. during a period after leaving the primary wave of the board before contacting with the secondary wave of the board; and cooling the board such that the temperature of the board is 120 to 180° C. at a point in time which is 10 seconds later from a point in time at which the board leaves the secondary wave.

(Mode 38)

The process according to any one of Modes 21 to 25, 31 to 33 and 37, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

(Mode 39)

The apparatus according to any one of Modes 26 to 30 and 34 to 36, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

BRIEF DESCRIPTION OF DRAWINGS

FIG. 2(a) schematically shows a cross sectional view of a flow soldering apparatus in one example of the embodiment in FIG. 1 taken along line X—X, and FIG. 2(b) schematically shows a perspective view of a heating cover which is provided in the flow soldering apparatus shown in FIG. 2(a);

DETAILED DESCRIPTION OF THE INVENTION

Figure 1:
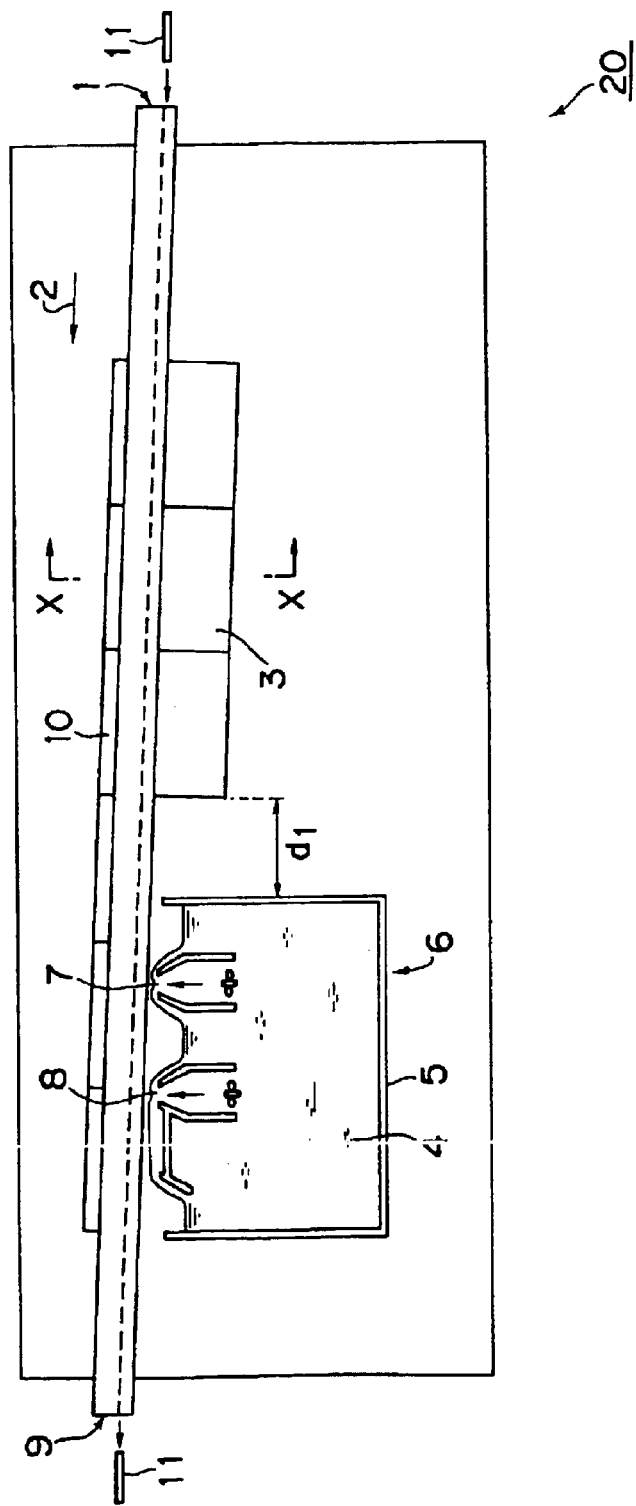
FIG. 1 schematically shows a side view of a flow soldering apparatus in one embodiment of the present invention.

Hereinafter, embodiments of the present invention will be described with reference to the drawings. It is noted that the embodiments will be described mainly about points different from the conventional flow soldering process and apparatus.

(Embodiment 1)

A flow soldering apparatus 20 of the embodiment shown in FIG. 1 has a configuration similar to that of the conventional flow soldering apparatus which is described with reference to FIGS. 15 to 18, but it is different from the conventional apparatus in that the apparatus of FIG. 1 additionally includes a heating cover 10 which is provided to extend over the conveyance line of the board 11 so as to cover an area above of the preheater 3 and the solder material supplying means 6 (or so as to close tops of the preheating zone and the solder material supplying zone and thereby isolate them from their surrounding spaces). Hereinafter, a flow soldering process for mounting the electronic component onto the board by using such flow soldering apparatus 20 will be described.

Flux (not shown) is firstly applied onto a lower surface of the board, which is provided with an electronic component (s) appropriately at a determined position, by using for example a foaming or spraying mode fluxer. Thus, resultant board 11 enters the apparatus 20 through the inlet 1, and is mechanically conveyed in the direction of the arrow 2 along the conveyance line (shown as a broken line in FIG. 1) from the inlet 1 to the outlet 9. As in the conventional process, the conveyance of the board 11 is conducted by holding the board 11 with conveyance fingers 12a and 12b and moving the conveyance fingers 14a and 14b, to which the chains 12a and 12b are connected, around the conveyer frames 13a and 13b, respectively.

Referring to FIG. 2, the chain 14a is shown as a "going" chain portion located on a side of the conveyer frame 13a which is aside of the board 11 and a "returning" chain portion located on the other side of the conveyer frame 13a, and the chain 14b is also shown similarly to the chain 14a.

In order to make sliding adjustment of the distance between the fingers 12a and 12b possible depending on the width of the board 11, it is preferable to use the conveyer frames 13a and 13b wherein one conveyer frame 13a is a fixed base conveyer frame, and the other conveyer frame 13b is a distance adjustable conveyer frame which can slide in a direction perpendicular to the conveyance direction 2 of the board 11 while keeping its parallel relationship with the fixed conveyer frame 13a (that is, slide in a left/right direction in the sheet of FIG. 2(a) shown as a left and right arrow in FIG. 2(a)).

It is noted that the fluxer described above may be installed inside the flow soldering apparatus 20. In this case, the board 11 to which the flux has not yet been applied enters into the apparatus 20 through the inlet 1, and the flux is applied to the lower surface of the board 11 upstream of the preheater 3 while the board is conveyed.

When the board 11 is then conveyed over the preheater 3 in due course, the board 11 is previously heated (prior to the solder material supplying step) in the preheating step from above and below the board by using the heating cover 10 which extends over the board 11 as well as the preheater 3 which is located under the board 11, respectively. By using such heating cover 10 together with the preheater 3, the heat dissipation of the preheating atmosphere gas in the preheating zone which intervenes between the heating cover 10 and the preheater 3 is effectively alleviated, so that the thermal efficiency of the flow soldering apparatus 20 can be increased. At the same time, it is possible to heat the board 11 from not only below the board but also above the board (such heating includes suppression of the temperature decrease of the board). Thus, the board 11 can be heated to a temperature higher than in the conventional process. The board 11 which is heated as described above is subsequently conveyed above the solder material supplying means 6. It is understandable that the board 11 has a temperature higher than in the conventional process at the beginning of the solder material supplying step in which the solder material supplying means 6 is used, more specifically upon contacting the board 11 with the primary wave 7.

It is sufficient that the heating cover 10 is provided so as to close (or cover) the top of the preheating zone, which is positioned above the preheater 3. The cover extends over the conveyance space through which the board 11 is passed along the conveyance line (shown as the broken line in FIG. 1). For the purpose of further increasing the thermal efficiency, it is preferable to provide the heating cover 10, as in this embodiments such that it extends over the preheater 3 and the solder material supplying means 6 so as to close further the top of the solder material supplying zone which is positioned above the solder material supplying means 6.

Such heating cover 10 is preferably constructed by applying a heating element(s) 10b such as a hot-wire heater to a cover body 10a which is made of a transparent material having a sufficient heat resistance such as a glass and which has a curved cross sectional form, for example a hemicylindrical form. It is possible to visually monitor the inside of the apparatus from the outside thereof by selecting the transparent material for the cover body 10a. The board 11 is conveyed while being held with the conveyance fingers 12a and 12b as described above, and there is a possibility of dropping of the board 11 off the fingers 12a and 12b, and particularly a fire risk may exist if the board falls on the preheater 3. However, when the transparent material is used for the cover body 10a as in this embodiment, an unusual situation of, for example, dropping of the board 11 can be discovered earlier and the occurrence of the fire and so on can be prevented.

Figure 3:
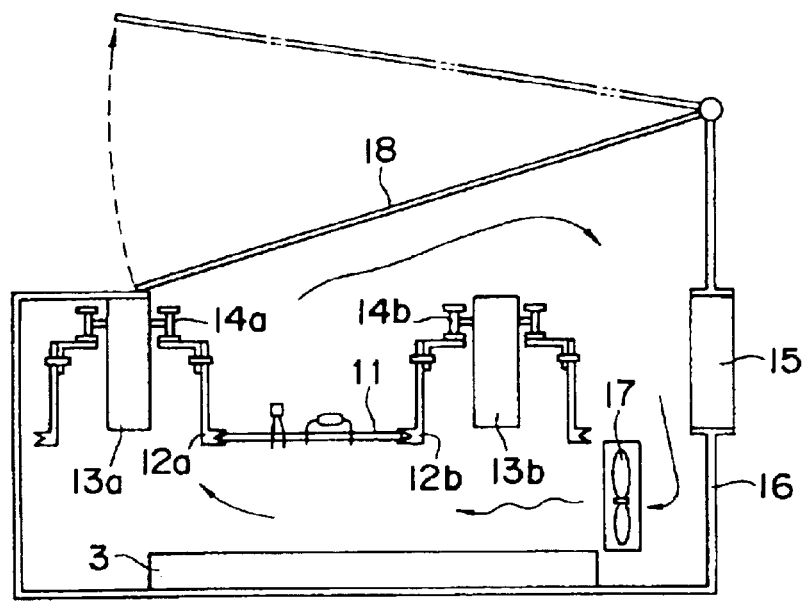
FIG. 3 schematically shows a cross sectional view of a flow soldering apparatus in another example of the embodiment of FIG. 1, which corresponds to a cross sectional view of the flow soldering apparatus in FIG. 1 taken along line X—X.
Figure 4:
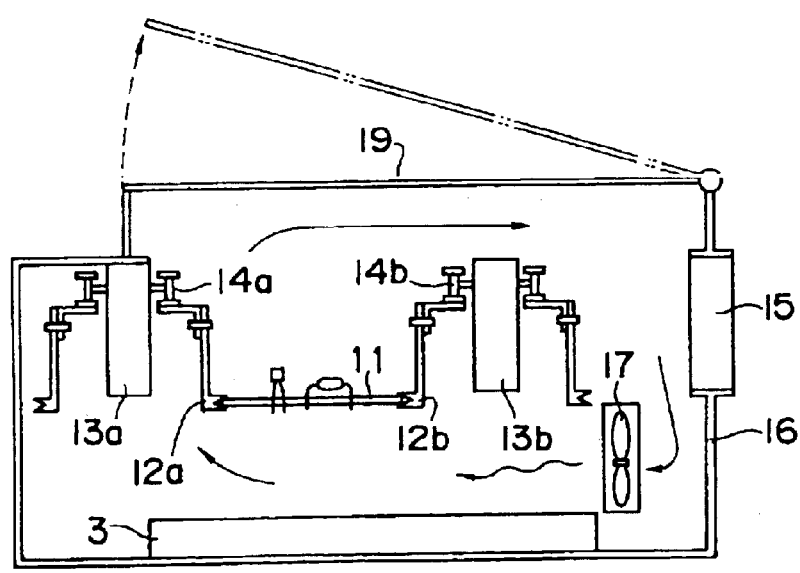
FIG. 4 schematically shows a cross sectional view of a flow soldering apparatus in yet another example of the embodiment of FIG. 1, which corresponds to a cross sectional view of the flow soldering apparatus in FIG. 1 taken along line X—X.

Additionally, the heating cover 10 can preferably be opened and closed as shown with a broken line in FIG. 2(*a*) by means of a hinge which is located in the vicinity of the fixed frame 15 for the purpose of ready maintenance of the flow soldering apparatus 20. Heating covers 18 and 19, which are shown in FIGS. 3 and 4, respectively and have a flat plate form may be used in place of the heating cover 10 having the hemicylindrical form. In this case, the heating cover 18 which is slantingly provided (FIG. 3) is more preferable than the heating cover 14 which is horizontally provided (FIG. 4) since the inside of the apparatus is readily monitored through the transparent cover body in the former.

It is preferable that the heating cover 10 (or the heating element 10*b*) preferably consists of plural sections aligned in the conveyance direction as shown in the drawing and the heating temperature of the heating element 10*b* in each section is controlled. Further, the preheater 3 is also preferably divided into sections so as to control the heating temperature thereof on each section basis. According to such configuration, heating of the board 11 can be regulated depending on positions on the conveyance line, so that a desirable temperature profile of the board can be obtained while avoiding rapid heating of the board for example.

In the preheating step in which the heating cover 10 and the preheater 3 described above is used, the board 11 is conveyed through a tunnel like structure in the direction of the arrow 2 (that is, a direction perpendicular to the sheet of the FIG. 2(*a*) and penetrating the sheet from its backside to its front) which structure is formed by the heating cover 10 and the channel structure 16 provided with the preheater 3 as shown in FIG. 2(*a*). In the tunnel like structure, a fan 17 is preferably located as a forced convection generating device so as to forcedly convect an atmosphere gas of the preheating zone between the heating cover 10 and the preheater 3. The temperature of the atmosphere gas of the preheating zone is increased by heating of the heating cover 10 and the preheater 3. By conducting the preheating step while the atmosphere gas of the preheating zone having the increased temperature is forcedly convected in the tunnel like structure by means of the fan 17 as described above, the thermal efficiency of the flow soldering apparatus 20 can be further increased, and the board can be supplied to the following solder material supplying step with its higher temperature. It can be readily understood by those skilled in the art that a position and a blast rate of the fan 17, a number of the fans and so on can be modified conformably to the flow soldering apparatus. Alternatively, a means (or device) for supplying a compressed air can be used as the forced convection generating means in place of the fan 17, and the compressed air can be discharged into the tunnel like structure through the compressed air injecting port which is located at the position of the fan 17.

According to the preheating step as described above, the board 11, which is beforehand heated to the temperature higher than in the conventional process, is subsequently conveyed into and above the solder material supplying means 6 shown in FIG. 1 where the solder material supplying step is conducted. This step may be as in the conventional process. Specifically, the step is conducted by contacting the lower surface of the board 11 with the molten solder material 4 in the form of the primary wave 7 and the sequential secondary wave 8 which is placed in the solder bath 5. Then, the board 11 which has experienced the solder material supplying step is taken out through the outlet 9. Thereby the electronic circuit board is obtained wherein the electronic component is mounted onto the board 11 according to the flow soldering process.

Since the board 11 is heated by the preheating step described above to the higher temperature than in the conventional process, the temperature of the board 11 is also higher than in the conventional process at the beginning of the solder material supplying step, more specifically upon contacting the board 11 with the primary wave 7. As a result, it is possible to suppress the temperature decrease of the solder material which is supplied and adhered to the board compared with the temperature decrease in the conventional case even when the lead-free solder material is used as the solder material. Thus, the wettability of the solder material is kept at a sufficiently high extent, and the solder material which is adhered to the board through the primary wave can avoid partially solidifying before the board makes contact with the secondary wave. Therefore, it becomes possible to effectively reduce the occurrence ratios of the "insufficient rising", the "bridge", and the like in the electronic circuit board produced by this embodiment while using the lead-free solder material as the solder material compared with those in the electronic circuit board produced by the conventional process and apparatus.

(Embodiment 2)

The flow soldering apparatus of this embodiment is obtained by, in place of providing the heating cover 10, locating the preheater 3 and the solder bath 5 closer to each other in the flow soldering apparatus 20 of the Embodiment 1 which is described with reference to FIG. 1. Though the gap $d_1$ between the preheater 3 and the solder bath 5 in the embodiment of FIG. 1 is about 70 to 150 mm similar to the conventional apparatus, such gap $d_1$ in the flow soldering apparatus of this embodiment is 20 to 60 mm.

In the flow soldering process of this embodiment in which the apparatus described above is used, the board is conveyed across the gap described above and subjected to the solder material supplying step after the board has experienced the flux applying step and the preheating step according to a manner substantially the same as in the Embodiment 1 (that is, similar to the conventional process) except the heating cover covering above the board. The temperature profile of the board during those steps is shown in FIG. 5.

Figure 5:
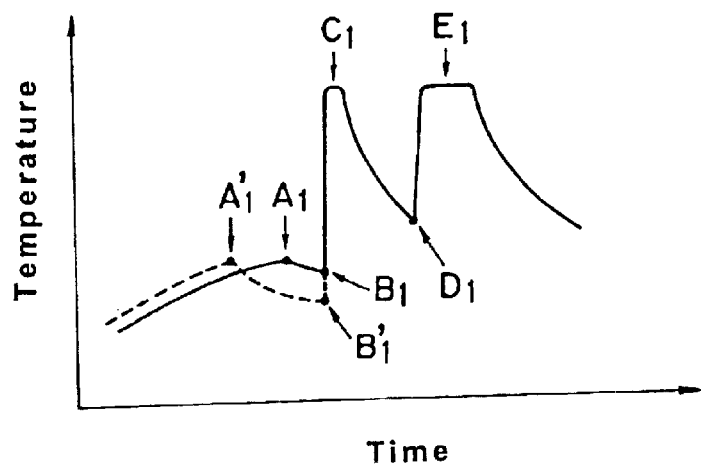
FIG. 5 shows a schematic graph of a temperature profile of a board when it is transferred from a preheating step to a solder material supplying step in another embodiment of the present invention while comparing a temperature profile in a case of using the conventional flow soldering process and apparatus.

Referring to FIG. 5, the ordinate axis indicates a temperature of the board (arbitrary unit); the abscissa axis indicates time (arbitrary unit), which axis therefore corresponds to a position of the board on the conveyance line in the apparatus; the solid line is a temperature profile in this embodiment; and the dashed line is a temperature profile in the case of using the conventional flow soldering process and apparatus. In FIG. 5, these temperature profiles are shown so as to overlaps to each other at the point in time at which the board contacts with the primary wave.

According to the temperature profile of this embodiment shown as the solid line in FIG. 5, the temperature of the board (that is, the temperature of the lower surface of the board, more specifically the temperature of the surface of the land portion which locates on the lower side of the board) starts to decrease at point $A_1$ where the board having been preheated in the preheating step leaves the above of the downstream end of the preheater 3. Then, the board contacts with the primary wave at point $B_1$ and the temperature of the board rapidly increases to a temperature substantially the same as the temperature of the molten solder material and maintained at that temperature at top $C_1$ followed by decreasing after the board leaves the primary wave. Next, the board contacts with the secondary wave at point $D_1$ and the temperature of the board again rapidly increases to the temperature substantially the same as the temperature of the molten solder material and maintained at that temperature at top $E_1$ followed by decreasing after the board leaves the secondary wave. It should be noted that the temperature of the body of the board is not increased to such a temperature as at tops $C_1$ and $E_1$ since the periods during which the board contacts with the primary wave and the secondary wave are short, and especially the period for contacting of the board with the primary wave is very short.

The temperature decrease of the board after being (pre) heated in the preheating step before contacting with the primary wave in this embodiment is calculated by subtracting the temperature at point $B_1$ from the temperature at point $A_1$, and this value is about 1 to 2° C. More concretely, in the case of the gap $d_1$=30 mm, the conveyance speed of the board of 1.2 m/min., the temperature at point $A_1$ of about 110° C., and the temperature of the molten solder material (i.e. the temperature at tops C and E) of about 250° C., the temperature of the board at point $B_1$ can be about 109° C. and therefore the temperature decrease between point $A_1$ and point $B_1$ can be about 1° C. Thus, the temperature decrease of the board between preheating in the preheating step and contacting with the primary wave can be made not greater than about 3° C. and preferably not greater than about 2° C.

On the contrary to the above, referring the conventional temperature profile shown in FIG. 5 as the dashed line, a period from a point in time at which the board leaves the preheater to a point in time at which the board contacts with the primary wave is made longer since the gap between the preheater and the solder bath is larger than that in this embodiment, and therefore the temperature decrease of the board during this period becomes larger. The temperature decrease in the conventional process is calculated by subtracting the temperature at point $B_1'$ from the temperature at point $A_1'$ which is substantially the same as that at point $A_1$, and generally is about 5 to 20° C. More concretely, in the case of the gap $d_1$=100 mm, the conveyance speed of the board of 1.2 m/min., the temperature at point $A_1'$ of about 110° C., and the temperature of the molten solder material (i.e. the temperature at tops C and E) of about 250° C., the temperature of the board at point $B_1'$ is about 100° C. and the temperature decrease between point $A_1'$ and point $B_1'$ is about 10° C.

According to this embodiment, the temperature decrease from the point in time at which the board leaves the preheater (that is, after the board has passed over the downstream end of the preheater) to the point in time at which the board contacts with the primary wave is smaller than that in the conventional case, so that the temperature of the board body is also retained at a temperature higher than that in the conventional case. As a result, a difference between the temperature of the board body and the temperature of the molten solder material which is supplied to the board becomes smaller, and an amount of heat which the solder material loses through the board after being supplied to the board is reduced. Thus, the temperature decrease of the solder material which adheres to the board can be suppressed.

As described above, it is also possible in this embodiment as in Embodiment 1 to suppress the temperature decrease of the solder material which is supplied and adheres to the board compared with in the conventional case even when the lead-free solder material is used as the solder material, so that similar effects as in Embodiment 1 can also be obtained. Thus, the flow soldering process and the apparatus of this embodiment are also suitable for using as the solder material the lead-free solder material as described above, and it becomes possible to effectively reduce the occurrence ratios of the "insufficient rising", the "bridge", and the like.

Figure 6:
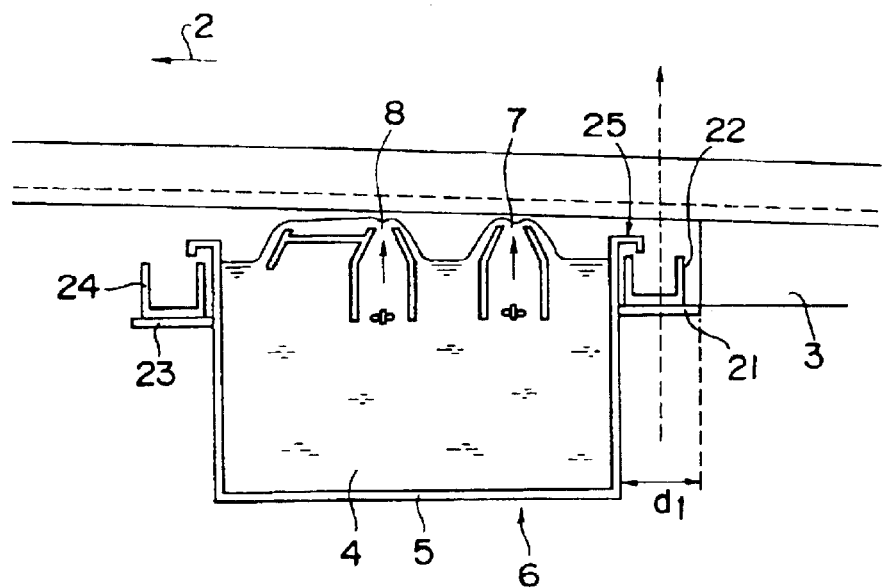
FIG. 6 schematically shows a partial cross sectional view of the vicinity of a solder material supplying means of the flow soldering apparatus described with reference to FIG. 5.

Additionally, the apparatus of this embodiment preferably includes a plate member 21 shown in FIG. 6 as a closing element for closing the gap between the preheater 3 and the solder bath 5 to obstruct a gas stream passing through the gap. The gap between the preheater and the solder bath is generally provided for avoiding possible formation of a short circuit as to the preheater when the solder material 4 occasionally spills over from the solder bath 5 by some external factor and contacts with the preheater 3. Further, an ambient gas in the conveyance space of the board is generally suctioned upwardly and discharged through an exhaust duct in order to removing smoke which is generated by vaporizing of a solvent contained in the flux. By providing the plate member 21 to close the gap, it is avoidable that a gas having a low temperature in the outside of the conveyance space passes through the gap between the preheater 3 and the solder bath 5 upwardly (in a direction of an arrow of a broken line shown in FIG. 6) and flows into the conveyance space. As a result, it is possible to suppress the temperature decrease of the board which may be caused by the inflow of the gas having a low temperature from the outside of the conveyance space, and therefore to make the temperature of the board at the beginning of the solder material supplying step much higher. Thus, it becomes possible to effectively reduce the occurrence ratios of the "insufficient rising", the "bridge", and the like in the case using the lead-free solder material.

Though such a closing means (the closing means 21) is preferably used in combination with this embodiment, the closing means may be used alone without reducing the gap between the preheater 3 and the solder bath 5. In this case, the temperature decrease of the board from preheating in the preheating step to contacting with the primary wave can be made not greater than about 3° C. and preferably not greater than about 2° C. Thus, it is possible to make the temperature of the board at the beginning of the solder material supplying step higher than in the conventional case, and thus to effectively reduce the occurrence ratios of the "insufficient rising", the "bridge", and the like in the case using the lead-free solder material.

Figure 7:
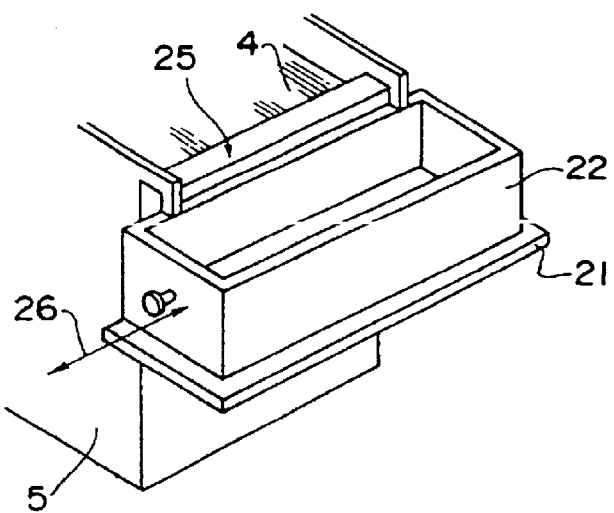
FIG. 7 schematically shows a perspective view of the vicinity of a solder receiving box provided in the flow soldering apparatus of FIG. 6.

In the case of using the plate member 21 as described above, it is preferable to locate a solder receiving container 22 on the plate member 21 while utilizing the plate member 21 as a sole plate as shown in FIGS. 6 and 7. Referring to FIG. 7, a guide 25 is preferably provided at the top of the solder bath 5 such that the solder receiving container 22 can receive the solder material 4 when it spills over, and the solder receiving container 22 is preferably such that it can be pulled out in the direction of an arrow 26. If the solder material 4 spills over from the solder bath 5 by an earthquake for example, a short circuit may be formed by the solder material 4 which contacts with the preheater 3, which causes a concern of a fire. However, an accident of the fire can be obviated since the solder material 4 can not contact with the preheater 3 by locating such solder receiving container 22. Additionally, the solder receiving container 22 is also used for receiving the dross upon the removal of the dross from the solder material as a routine work, and thereby workability of the removal of the dross can be improved. Further, in addition to upstream of the solder bath 5, it is more preferable to locate a solder receiving container 24 and a plate member 23 downstream of the solder bath 5 which are similar to those located upstream of the solder bath 5.

Though the process/apparatus of this embodiment have advantages as described above even when they are employed as they are, it is preferable that they are combined with the process/apparatus of Embodiment 1.

(Embodiment 3)

Figure 8:
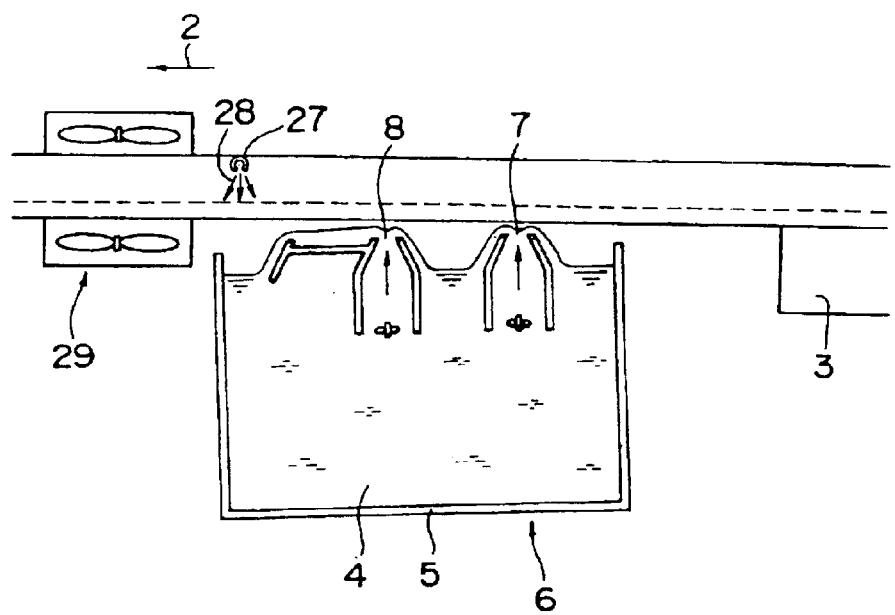
FIG. 8 schematically shows a partial cross sectional view of the vicinity of a solder material supplying means of the flow soldering apparatus in yet another embodiment of the present invention.

The flow soldering apparatus of this embodiment is obtained by adding an air curtain forming means 27 (FIG. 8) to the flow soldering apparatus 20 of the Embodiment 1 which is described with reference to FIG. 1 in place of providing the heating cover 10. Though cooling means 29 (which will be described later) are shown in FIG. 8 for cooling the board which means is located downstream of the air curtain forming means while sandwiching the conveyance line, the cooling means is not necessarily required for conducting this embodiment.

Also, in this embodiment, the flow soldering apparatus as described above can carry out the flow soldering process including the flux applying step, the preheating step and the solder material supplying step similarly to the Embodiment 1 except that the heating cover covers the above of the board (i.e. similarly to the conventional process), but there is provided a difference between them by using the air curtain forming means 27 as below.

The air curtain forming means 27 forms an air curtain which functions as an insulation means for thermally insulating an atmosphere gas of the solder material supplying zone which exists above the solder material supplying means 6 from an atmosphere gas of a zone downstream of the solder material supplying zone in the conveyance direction of the board, wherein the latter atmosphere gas has a temperature lower than that of the former one. With the air curtain forming means 27, a gas (preferably nitrogen gas) having a high temperature (preferably about 200 to 400° C.) flows inside a pipe which is provided with a slit (or an aperture) having an appropriate size and shape, and the gas is ejected through the slit of the pipe so as to traverse the conveyance line of the board (shown with a broken line in FIG. 8) which is conveyed in the conveyance direction 2, so that the air curtain 28 is formed.

Generally, the atmosphere gas of the solder material supplying zone is heated by the preheater 3 used for the preheating step (in the case of Embodiment 1, the preheater 3 and the heating cover 10) and the solder material 4 having a high temperature used for the solder material supplying step. On the other hand, since the atmosphere gas of the zone downstream of the solder material supplying zone in the conveyance direction 2 is less thermally influenced by the solder material 4 and so on, so that the atmosphere gas has the temperature lower than that of the solder material supplying zone. Thus, because of a temperature difference between the atmosphere gas of the solder material supplying zone and the atmosphere gas having the lower temperature of the zone downstream of the solder material supplying zone, an amount of heat of the atmosphere gas of the solder material supplying zone escapes and dissipates into the atmosphere gas having the lower temperature.

However, since the air curtain 28 is formed between the atmosphere gases of the solder material supplying zone and of the zone downstream thereof having the lower temperature, it is possible to suppress the heat dissipation of the atmosphere gas of the solder material supplying zone and keep the temperature of the atmosphere gas of the solder material supplying zone higher. Thus, it is possible to make the temperature of the board which is exposed to the atmosphere gas of the solder material supplying zone higher, and therefore to reduce the occurrence ratios of the "insufficient rising", the "bridge" and the like in the case of using the lead-free solder material.

The isolating means such as the air curtain as described above can be located at any position as long as it locates downstream of a position at which the board contacting with the secondary wave of the solder material leaves the secondary wave of the solder material. The isolating means is preferably located at a position where the isolating means has no influence upon the external form (or surface) of the secondary wave. The isolating means can be located so as to isolate the atmosphere gas while traversing the conveyance space of the board above the vicinity of the downstream end of the solder bath.

Additionally, the flow soldering apparatus of this embodiment is particularly preferable when it is provided with the cooling means 29 such as a fan for blowing a gas, a spray for spraying or ejecting a liquid or the like.

When the lead-free solder material is used as the solder material, there is caused a problem of the occurrence of the so-called "lift-off". For reducing the occurrence ratio of such "lift-off", it is desirable to positively cool the board after the solder material supplying step as described in Japanese Patent Application No. 2001-241979 which is owned by the applicant of the present application and which claims a domestic priority from Japanese Patent Applications No. 2000-249588. It is noted that the contents of the applications are incorporated herein by the reference thereto in their entireties.

For conducting this cooling step, the board may be blown by a gas preferably having a low temperature while using, for example, a fan or a spot cooler, or may be sprayed with a liquid by using a spray. Since an atmosphere gas of a cooling zone in which the gas and/or the liquid for cooling exists (that is, a zone for cooling the board which zone is located downstream of the solder material supplying zone) has a temperature lower than that of the solder material supplying zone which is immediately upstream of the cooling zone in the conveyance direction, the atmosphere gas of the cooling zone absorbs an amount of heat from the atmosphere gas of the solder material supplying zone and lowers a temperature of such gas. By lowering the temperature of the atmosphere gas of the solder material supplying zone in the solder material supplying step, the temperature of the board in the solder material supplying step is also decreased.

However, the decrease in the temperature of the board as described above can be suppressed in this embodiment by means of the air curtain 28 so as to thermally isolate the atmosphere gas of the solder material supplying zone from the atmosphere gas, which has the lower temperature than that of the solder material supplying zone, of the cooling zone which is positioned downstream of the solder material supplying zone in the conveyance direction 2. Thus, it is possible to suppress the temperature decrease of the board in the solder material supplying step which may otherwise be caused in the case wherein the board is cooled after the solder material supplying step, and to reduce the occurrence ratios of the "insufficient rising", the "bridge", the "lift-off" and the like in the case of using the lead-free solder material. Further, the thermal efficiency of the apparatus as a whole is increased.

Though the process/apparatus of this embodiment have advantages as described above even when they are employed as they are, it is preferable that they are combined with the process/apparatus of Embodiment 1 and/or Embodiment 2. The combination of all of Embodiments 1 to 3 is especially preferable since the temperature decrease of the board in the solder material supplying step is particularly suppressed.

(Embodiment 4)

Figure 9:
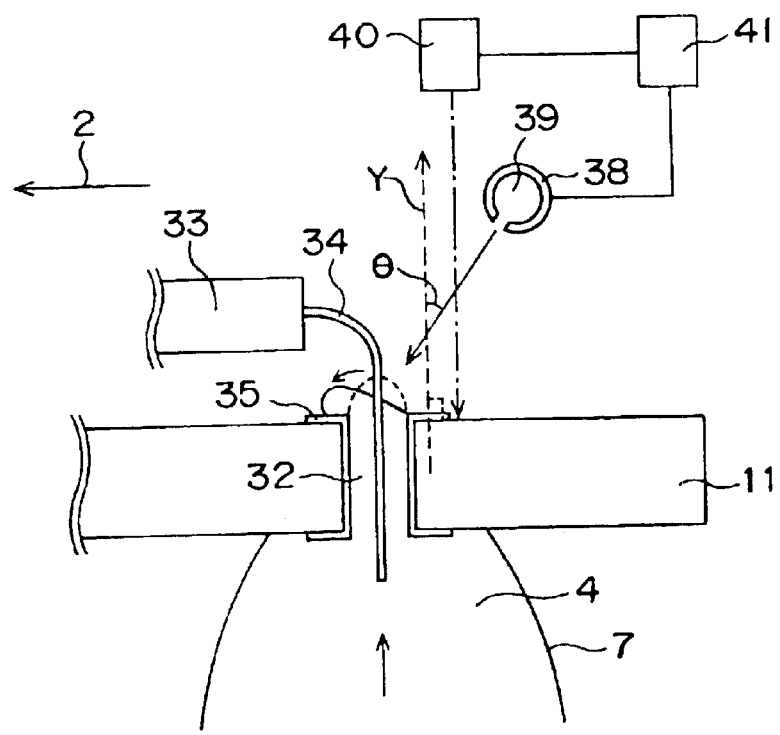
FIG. 9 schematically shows an enlarged view of a portion of a board and its vicinity for explaining a flow soldering process in one embodiment of the present invention when a through hole of the board is located on a primary wave.

The flow soldering apparatus of this embodiment is different from the flow soldering apparatus 20 of the Embodiment 1 which is described with reference to FIG. 1 in that the apparatus of this embodiment is provided with a blowing means 38 for blowing a gas 39 which has a high temperature onto the upper surface of the board 11 which is located on the primary wave of the molten solder material as in FIG. 9, in place of providing with the heating cover 10. As the blowing means 38, it is possible to use a means which is configured such that a gas (preferably nitrogen gas) having a high temperature (preferably about 200 to 400° C.) flows inside a pipe which is provided with a slit (or an aperture) having an appropriate size and shape, and the gas is ejected through the slit of the pipe to blow the upper surface of the board 11 which is conveyed. The blowing means 38 preferably blows the gas 39 uniformly onto the board 11 over its whole width which is perpendicular to the conveyance direction 2 of the board 11 (i.e. a direction shown in the drawing as arrow 2) while the board 11 is conveyed under the blowing means 38.

Similarly to the conventional flow soldering process, the board 11 which has been subjected to the flux applying step and the preheating step is conveyed over the solder material supplying means 6 which supplies the solder material to the board by contacting the molten solder material 4 in the form of the primary wave 7 and the secondary wave 8 with the lower surface of the board 11 successively (see FIG. 1). When the through hole 32 of the board 11 is situated on the primary wave 7 in due course as shown in FIG. 9, the solder material 4 which is supplied in the form of the primary wave 7 rises up through an annular space between the lead 34 connected to the electronic component 33 and the part of the land 35 which forms the wall of the through hole 32. At this time, according to the flow soldering process of this embodiment, the gas 39 having the high temperature supplies an amount of heat to the board 11, more specifically the land which is formed to cover the through hole 32 of the board 11, and/or the solder material 4 which rises up in the through hole 32. As a result, it is possible to reduce an amount of heat which is taken out of the solder material 4 through the land 35 and the board 11 when the solder material 4 rises up in the through hole 32, so that the temperature decrease of the solder material 4 can be suppressed. Thus, the solder material 4 can rises up in the through hole sufficiently. Referring to FIG. 9, the gas 39 is preferably blown toward the board 11 at an angle in a cross section including the conveyance direction 2 of the board (i.e. in the sheet of FIG. 9), wherein the angle is slanted from the direction Y (shown in the drawing as an arrow Y) which is upwardly perpendicular to the upper surface of the board (or its principal surface) by an angle θ (theta)=−60 to +60 degrees (in FIG. 9, the angle θ (theta) is shown to be a plus value while slanting toward an upstream-side in the conveyance direction 2). As a result, a protrusion (or bulge) of the solder material 4 which projects from the upper surface of the board 11 can be flattened over the portion of the land 35, which is located on the upper surface of the board 11, by a pressure of the blown gas 39. Therefore, the solder material 4 comes to spread over the surface of the part of the land 35 locating on the upper surface of the board more readily.

The flow soldering apparatus of this embodiment preferably further includes a sensor 40 for detecting the presence of the board 11 and a controller 41 for controlling the blowing device to blow the gas 39 when the board is situated on the primary wave 7. A position at which the sensor 40 detects the presence of the board 11 may be any appropriate one with considering the conveyance speed of the board 11. Though the sensor 40 is shown to be positioned above a position at which the board 11 comes to contact with the primary wave 7 in this embodiment, it is preferable to position the sensor at the inlet of the apparatus and to blow the gas toward the board when the board reaches the primary wave while considering the conveyance speed of the board. According to the flow soldering apparatus of this embodiment, since the blow of the gas 39 from the blowing means 38 is controlled by the controller 41 depending on a result of the detection of the sensor 40 so as to blow the gas 39 when the board 11 situated on the primary wave 7, it is possible to reduce an amount of the used gas 39 for blowing toward the board 11 and an amount of power which is required to blow the gas.

The board 11 which contacts with the primary wave as described above then contacts with the secondary wave 8 (see, FIG. 1) and is taken out through the outlet 9 of the flow soldering apparatus as in the conventional flow soldering process and apparatus. Thus, an electronic circuit board is produced wherein the electronic component has been connected by flow soldering.

The flow soldering process and apparatus of this embodiment are appropriate for the case of especially using as the solder material the lead-free solder material as described above, and it is possible to effectively reduce the occurrence ratios of the "insufficient rising", the "bridge" and so on. In this case, it is desirable to estimate and control the quality of the lead-free solder material in the solder bath. For this purpose, a sensor for estimating the quality of the lead-free solder material by comparing a melting property of the solder material which is actually used in the solder bath for the flow soldering with a solder material having a predetermined composition while applying a principal of the differential thermal analysis can be used. Such a sensor is described in Japanese Patent Application No. 2001-171044 which claims domestic priorities from Japanese Patent Applications Nos. 2000-168903 and 2000-168904, which are all filed in the name of the present applicant. It is noted that the contents of those applications are incorporated herein by the reference thereto in their entireties.

(Embodiment 5)

Figure 10:
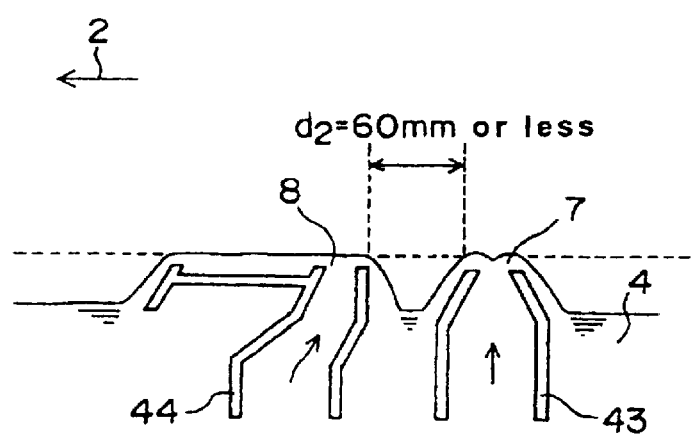
FIG. 10 schematically shows an enlarged view of the vicinity of a primary wave and a secondary wave in a flow soldering apparatus in another embodiment of the present invention.
Figure 17:
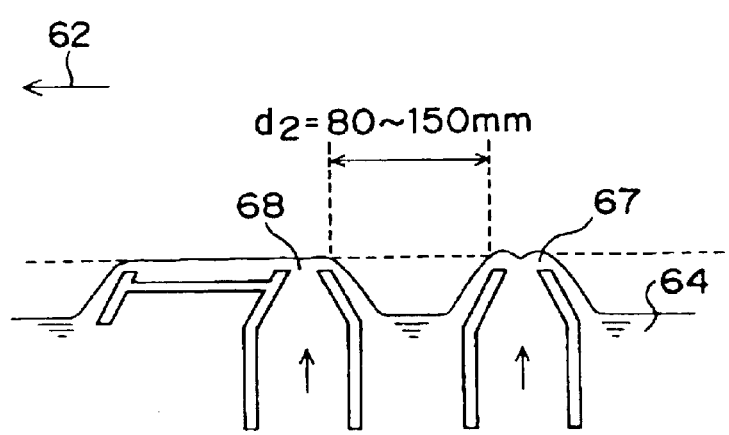
FIG. 17 schematically shows an enlarged view of the vicinity of a primary wave and a secondary wave in the flow soldering apparatus in FIG. 15.
Figure 18:
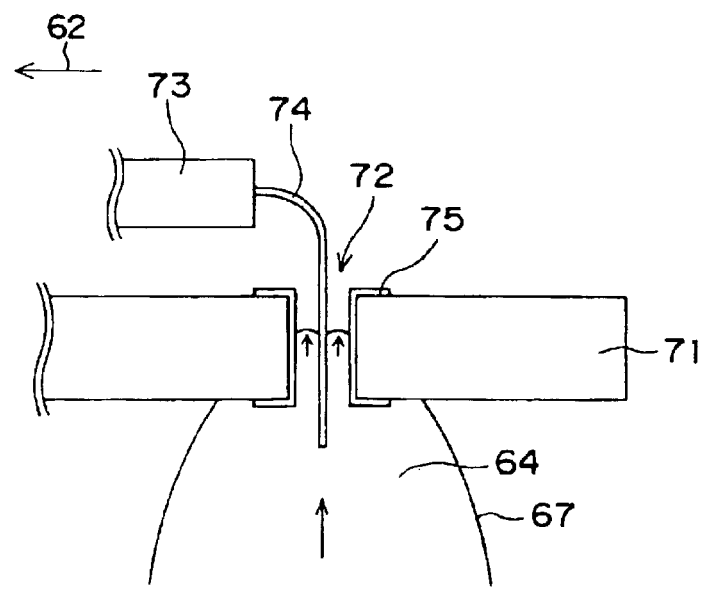
FIG. 18 schematically shows an enlarged partial view of a board for explaining a flow soldering process which uses the flow soldering apparatus shown in FIG. 15 when a through hole of the board is located on a primary wave.

The flow soldering apparatus of this embodiment has a configuration similar to the conventional flow soldering apparatus which is described with reference to FIGS. 15 to 18, but different from the conventional apparatus in that the apparatus of this embodiment is constructed so as to have a distance $d_2$ of about 60 mm or less, preferably about 30 to 50 mm, and more preferably about 40 mm between the primary wave 7 and the secondary wave 8 which are formed by the solder material supplying means as in FIG. 10. In the conventional flow soldering apparatus as shown in FIG. 17, the distance $d_2$ between the primary wave 67 and the secondary wave 68 is about 80 to 150 mm. In this embodiment as shown in FIG. 10, on the other hand, an upper part of a guide 44 which defines a flow of the secondary wave 8 is positioned closer to a guide 43 which defines a flow of the primary wave 7 so as to have the distance $d_2$ of the value as described above between the primary wave 7 and the secondary wave 8.

Figure 11:
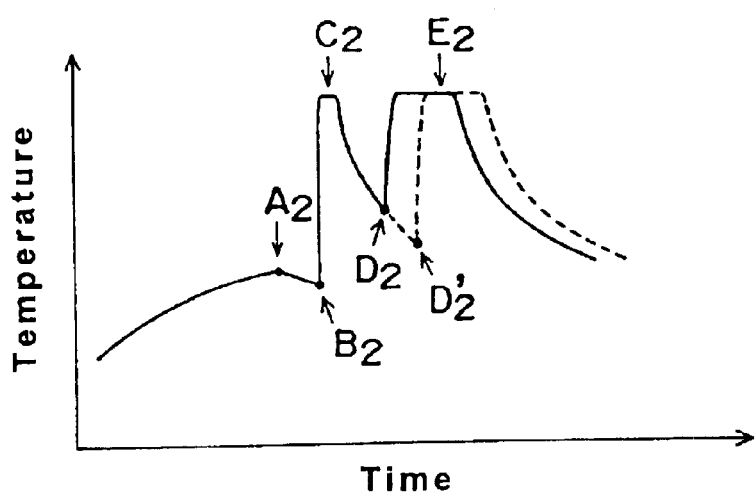
FIG. 11 shows a schematic graph of a temperature profile of a board in a solder material supplying step in the embodiment of FIG. 10 while comparing a temperature profile in a case of using the conventional flow soldering process and apparatus.

While using such flow soldering apparatus, the board 1 is first subjected to the flux applying step and the preheating step as in the conventional flow soldering process, and then subjected to the solder material supplying step using the solder material supplying means as described above. The temperature profile of such board is shown in FIG. 11. FIG. 11 corresponds to FIG. 5 which is referenced for describing the temperature decrease in the case of using the flow soldering process and apparatus of above described Embodiment 2. In FIG. 11, the solid line is the temperature profile in this embodiment, and the dashed line is the temperature profile in the case of using the conventional flow soldering process and apparatus.

According to this embodiment, as shown with the solid line in FIG. 11, the temperature of the board (that is, the temperature of the lower surface of the board, more specifically the temperature of the surface of the land portion which locates on the lower side of the board) starts to decrease at point $A_2$ where the board preheated in the preheating step leaves the above of the downstream end of the preheater 3. Then, the board contacts with the primary wave at point $B_2$ so that the temperature of the board rapidly increases to a temperature substantially the same as the temperature of the molten solder material and maintained at that temperature at top $C_2$ followed by decreasing after the board leaves the primary wave. Next, the board contacts with the secondary wave at point $D_2$ and the temperature of the board rapidly increases again to the temperature substantially the same as the temperature of the molten solder material and maintained at that temperature at top $E_2$ followed by decreasing after the board leaves the secondary wave.

The temperature decrease of the board after leaving the primary wave and before contacting with the secondary wave in this embodiment is calculated by subtracting the temperature at point $D_2$ from the temperature of top $C_2$ (i.e., the temperature which is substantially the same as the temperature of the molten solder material). More concretely, in the case of the gap $d_2$=4-mm, the temperature of the molten solder material (i.e. the temperature of tops C and E) of about 250° C., and thus the temperature of top $C_2$ of about 250° C., the temperature of point $D_2$ can be about 160° C. and therefore the temperature decrease can be about 90° C.

According to the conventional temperature profile shown with the dashed line in FIG. 11, on the other hand, since the distance $d_2$ between the primary wave and the secondary wave is larger than in this embodiment, the period after leaving the primary wave and before contacting with the secondary wave becomes longer, and therefore the temperature decrease of the board during such period becomes larger. The temperature decrease in the conventional process is calculated by subtracting the temperature at point $D_2'$ from the temperature at top $C_2'$. More concretely, in the case of the distance $d_2$=70 mm for example and the temperature of top $C_2$ of about 250° C., the temperature of point $D_2'$ is about 128° C. and therefore the temperature decrease is about 122° C. When the temperature decrease of such a large value is caused especially in the case of using the lead-free solder material, the solder material which adheres to the board by the primary wave partially solidifies, and this may derives the "insufficient rising", the "bridge" and so on. According to this embodiment, it becomes possible to suppress the temperature decrease of the board after leaving the primary wave and before contacting with the secondary wave by setting the distance between the primary wave and the secondary wave at 60 mm or less. Thus, the solder material which adheres to the board by the primary wave effectively avoids from partially solidifying especially in the case of using the lead-free solder material.

As described above, the flow soldering process and the apparatus of this embodiment are also suitable for using as the solder material the lead-free solder material as described above, and it is possible to effectively reduce the occurrence ratios of the "insufficient rising", the "bridge" and so on. Additionally, it is also preferable in this embodiment to estimate the quality of the lead-free solder material in the solder bath by means of the sensor as described in Japanese Patent Applications which are already referred to in the above.

Further, it is preferable to combine at least one of the features of Embodiments 1 to 4 with this embodiment. The flow soldering apparatus of this embodiment is preferably provided with the heating cover as described in Embodiment 1. Though the gap d, between the preheater and the solder bath may be similar to the gap of the conventional flow soldering apparatus, the gap is preferably about 20 to 60 mm as in Embodiment 2 described above. By thermally insulating so as to alleviate the heat dissipation of the atmosphere gas of the zone located above the solder bath and/or by effectively preheating the board in the preheating step as described above, the temperature decrease of the board can be suppressed furthermore, and it can be reduced to preferably not greater than 50° C. and more preferably not greater than 30° C.

(Embodiment 6)

Figure 12:
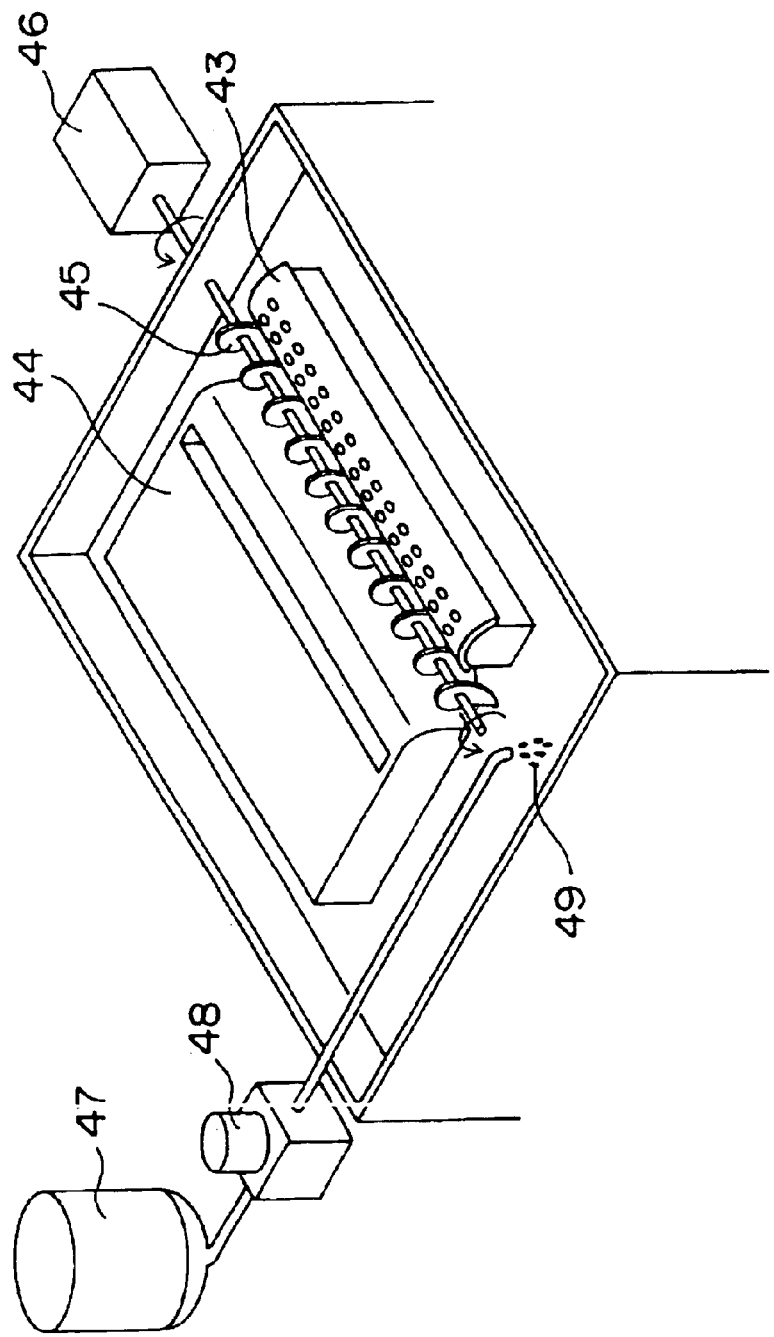
FIG. 12 schematically shows a perspective view of a solder material supplying means provided in a flow soldering apparatus in yet another embodiment of the present invention.

In addition to having the distance between the primary wave and the secondary wave not larger than 60 mm as in Embodiment 5 which is described above with reference to FIGS. 10 and 11, the flow soldering apparatus of this embodiment shown in FIG. 12 includes a screw 45 positioned between the guide 43 for the primary wave and the guide 44 for the secondary wave, a motor 46 for rotating the screw 45, a container 47 which includes a material containing vegetable oil and is connected to a line for supplying the material as the separating agent 49 into the solder bath, and a valve 48 for controlling the supply of the material from the container 47 to the solder bath. The screw 45 and the motor 46 form a discharging means for mechanically discharging the dross, which accumulates between the primary wave and the secondary wave, as a dross containing material from between the primary wave and the secondary wave. The container 47 and the valve 48 form a means for adding the vegetable oil containing material to the dross containing material which is discharged from between the primary wave and the secondary wave.

As to the solder material supplying means shown in FIG. 12, the primary wave (not shown in FIG. 12) flows out from an opening of the guide 43 (such as plural apertures as shown in FIG. 12) and runs down over the surface of the guide 43, and on the other hand the secondary wave (not shown in FIG. 12) flows out from an aperture(s) of the guide 44 (such as an elongated opening as shown in FIG. 12) and run down the surface of the guide 44. Though the dross is likely to accumulate between the primary wave and the secondary wave by selecting the distance of not greater than 60 mm between the primary wave and the secondary wave as in this embodiment when compared with the conventional case, the accumulating dross can be sent out in the form of the dross containing material by mechanically discharging it from between the primary wave and the secondary wave while rotating the screw 45 by means of the motor 46. When the separating agent 49 (the vegetable oil containing material) is added to the dross containing material which is thus discharged from the container 47 through the valve 48, the solder material is at least partially separated from the dross containing material and a dross containing material which has an increased content of the dross can be removed. As a result, a loss of the solder material can be reduced.

Figure 13:
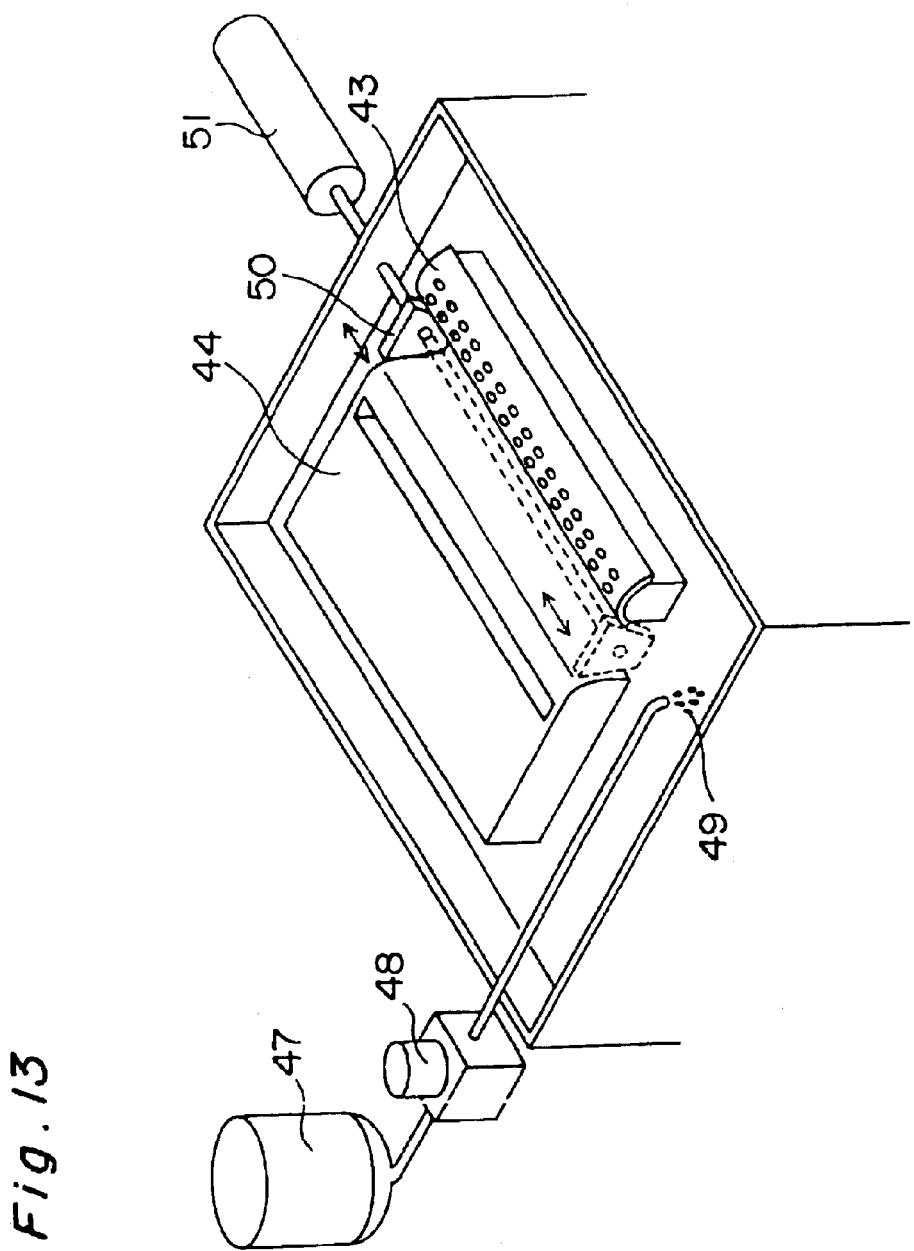
FIG. 13 schematically shows a perspective view of a solder material supplying means provided in a flow soldering apparatus in yet another embodiment of the present invention.

As the discharging means for mechanically discharging the dross, which accumulates between the primary wave and the secondary wave, as the dross containing material, the screw 45 and the motor 46 are used in this embodiment. Alternatively, it is also possible to use a plate member 50 which is adapted to a cross sectional shape of the gap formed between the guides 43 and 44 and an air cylinder (or a motor) 51 which reciprocates the plate member 50 between the guide 43 and 44 as shown in FIG. 13. By moving the plate member 50 by the air cylinder 51 from a proximal side to a distal side with respect to the air cylinder 51, the dross accumulating between the primary wave and the secondary wave is forced to move by the plate member 50 and discharged from between the primary wave and the secondary wave.

Such discharging means as described above may be used alone though it is preferably used in combination with the means for adding the vegetable oil containing material (the separating agent) as in this embodiment shown in FIG. 12 and in its modification shown in FIG. 13. The discharge of the dross containing material can be conducted continuously or intermittently as a part of a routine work. Furthermore, it is also desirable in this embodiment and its modification to estimate and control the quality of the lead-free solder material in the solder bath by means of the sensor as described in the above with reference to the Japanese Patent Applications.

(Embodiment 7)

This embodiment relates to a temperature profile of the board in the flow soldering process by means of the lead-free solder material. More specifically, the board is contacted with the primary wave, wherein the board has been previously heated (preheated) such that the temperature of the board is in a range of 120° C.±30° C. (i.e. 90 to 150° C.) before point in time $a_0$ at which the board comes to contact with the primary wave. Next, the temperature of the board is maintained at not less than 200° C. from point in time $b_1$ at which the board leaves the primary wave to point in time $b_2$ at which the board comes to contact with the secondary wave. Then, the board is cooled such that the temperature of the board is in a range of 150° C.±30° C. (i.e. 120 to 180° C.) at point in time $c_1$ which is 10 seconds later from point in time $c_0$ at which the board leaves the secondary wave.

Figure 14:
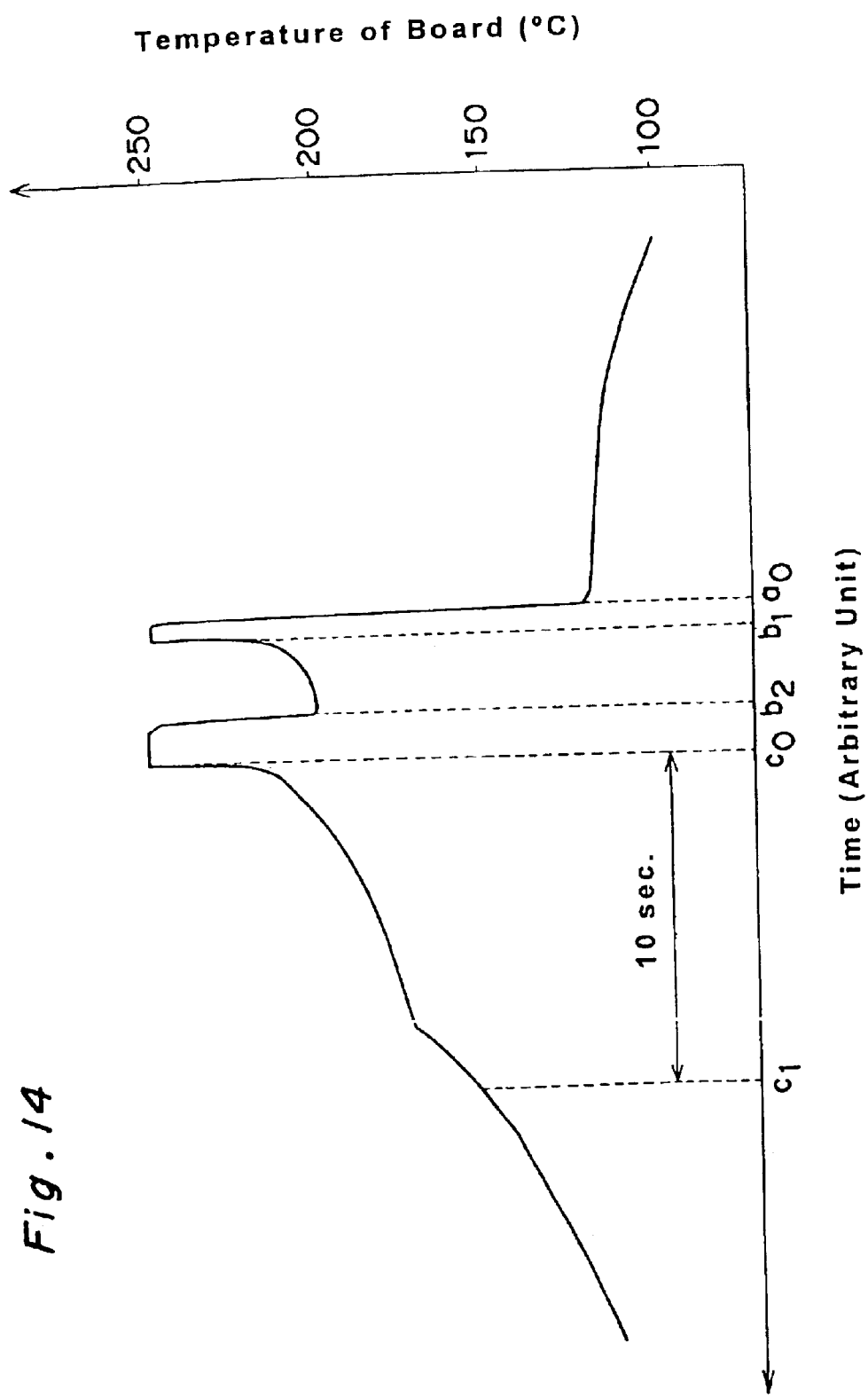
FIG. 14 shows a schematic graph of a temperature profile of a board in yet another embodiment of the present invention.
Figure 15:
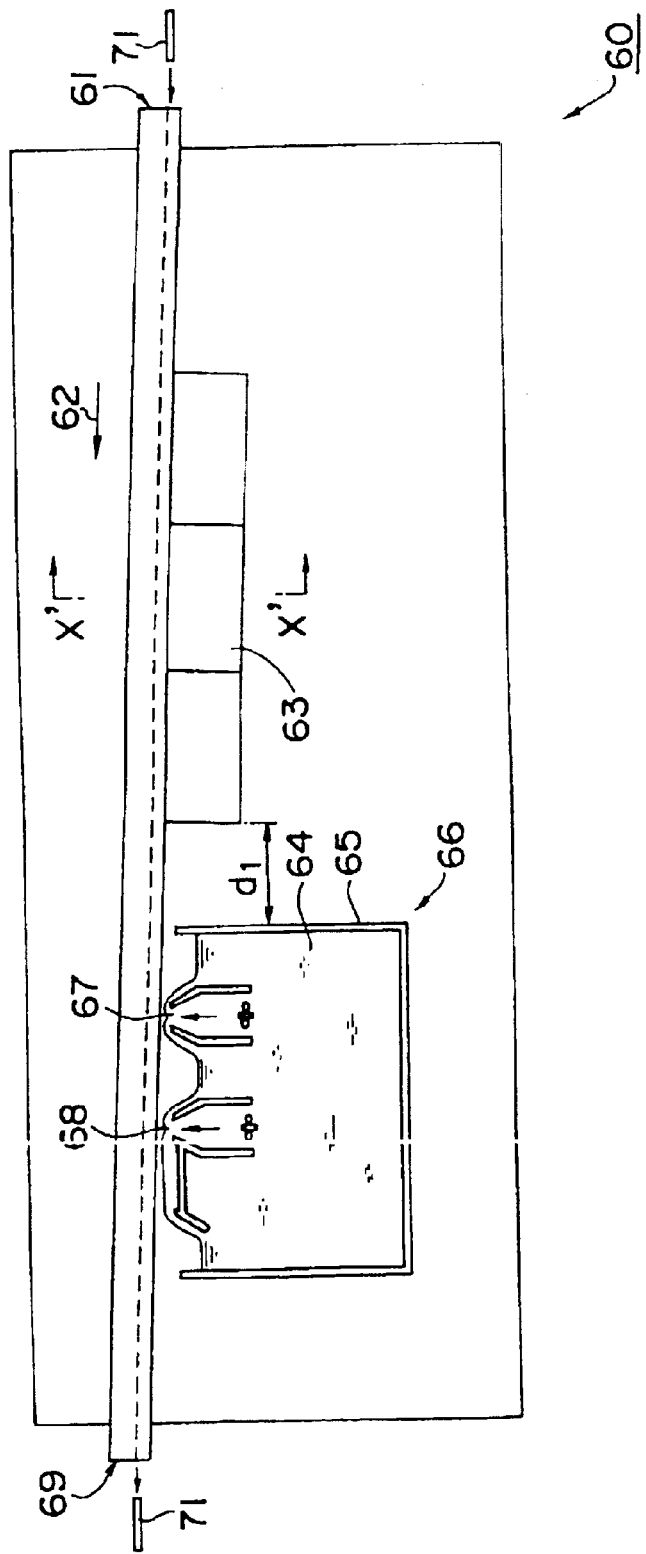
FIG. 15 schematically shows a cross sectional view of a conventional flow soldering apparatus.
Figure 16:
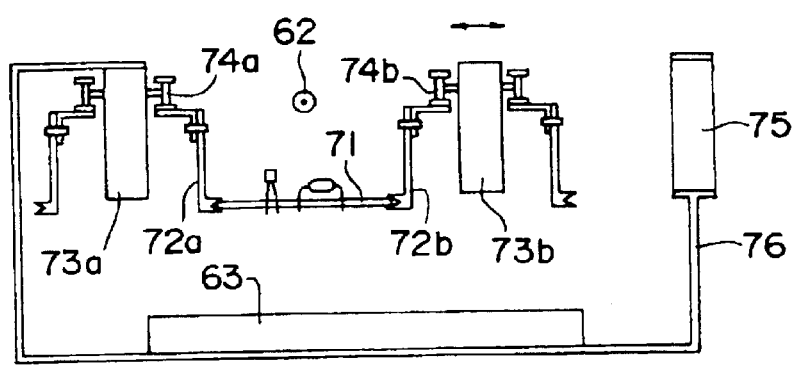
FIG. 16 schematically shows a cross sectional view of the flow soldering apparatus in FIG. 15 taken along line X'—X'.

It is noted that a time axis as the abscissa axis of the temperature profile in FIG. 14 is inverted from the temperature profiles in FIGS. 5 and 11 (that is, apparently, FIG. 14 and FIGS. 5 and 11 are laterally inverted to each other). In addition, it should be noted that a temperature profile which is shown as the solid line in FIG. 14 is merely an example of the temperature profile of the board, and that the present invention is not limited to this temperature profile.

Though points in time $a_0$ $b_1$ $b_2$ and $c_0$ of the temperature profile described above depend on a mutual positional relationships among the primary wave and the secondary wave in the flow soldering apparatus and the board which is conveyed on them, and the conveyance speed of the board, points in time $a_0$ $b_1$ $b_2$ and $c_0$ can be determined based on the temperature profile which is obtained by measuring the temperature of the board. First, point in time $a_0$ at which the board comes to contact with the primary wave can be determined as a point in time at which the temperature of the board first starts to rapidly increase on the temperature profile. Point in time $b_1$ at which the board leaves the primary wave can be determined as a point in time at which the temperature of the board starts to decease on the temperature profile after the temperature of the board has been rapidly increased from point in time $a_0$ determined as above and kept such increased temperature. Point in time $b_2$ at which the board comes to contact with the secondary wave can be determined as a point in time at which the temperature of the board starts to rapidly increase again on the temperature profile after point in time $b_1$ determined as above. And finally, point in time $c_0$ at which the board leaves the secondary wave can be determined as a point in time at which the temperature of the board starts to decease on the temperature profile after the temperature of the board has been rapidly increased from point in time $b_2$ determined as above and kept such increased temperature.

The temperature profile of this embodiment is appropriate for the case of setting the conveyance speed of the board at, for example, about 1 to 2 m/min. (or about 1.6 to 3.3 cm/min.). In the case where the board is conveyed at a speed in such range, the period after the board leaves the primary wave and before the board contacts with the secondary wave may be, for example, 3 to 5 seconds.

The temperature profile of this embodiment is appropriate for the case of flow soldering by means of the lead-free solder material. If a temperature profile which is generally used in the conventional flow soldering by means of the Sn—Pb based solder material is applied to the case of using the lead-free solder material, various soldering defects may be occur. However, in the case where the flow soldering is conducted according to the temperature profile as in this embodiment, it is possible to effectively reduce the occurrence ratios of the soldering defects even when the lead-free solder material is used. Hereinafter, this is explained in detail.

According to the conventional temperature profile which is generally used for the case of using the Sn—Pb based solder material, the board which is heated to about 70 to 80° C. is contacted with the primary wave. When the electronic component is soldered to the board by applying the above to the case of using the lead-free solder material so that the board having the temperature of about 70 to 80° C. contacts with the primary wave, there arise problems of the "red eye" caused by that the lead-free solder material can not sufficiently rises up in the through hole, and of unsatisfactory connection of the solder material between the fillet and the land.

On the other hand, the board is heated in this embodiment such that the temperature of the board is in the range of about 120° C.±20° C. (i.e. 90 to 150° C.) immediately before point in time $a_0$ at which the board contacts with the primary wave. The temperature of the board can be in the range of 90 to 150° C., for example, by controlling the temperature of the preheater which is used for preheating the board and/or by controlling the thermal efficiency for heating by the preheater while considering conditions such as a flow of the atmosphere gas in which the board is located during preheating. Since the board is heated to not less than 90° C. in this embodiment as described above, the lead-free solder material sufficiently rises up in the through hole, and therefore it becomes possible to obtain a satisfactory connection between the solder material and the land. On the other hand, since the temperature of the board is not greater than 150° C. in this embodiment, it is fully avoidable that the electronic component to be connected (or soldered) to the board is damaged by heat.

Furthermore, according to the conventional temperature profile which is generally used for the case of using the Sn—Pb based solder material, the significant temperature decrease of the board after the board leaves the primary wave and before the board comes to contact with the secondary wave occurs, so that the temperature of the board is decreased to about 100 to 180° C. When this is also applied to the case of using the lead-free solder material so as to solder the electronic component onto the board so that the board of which temperature is decreased to such a level is contacted with the secondary wave, various problems may be encountered. For example, the "bridge" may be caused because the form of the fillet is not well conditioned, the "red eye" may be caused because the lead-free solder material does not sufficiently rise up in the through hole, or the unsatisfactory connection may obtained between the fillet of the solder material and the land.

According to this embodiment, on the other hand, the temperature of the board can be maintained at or above 200° C. after point in time $b_1$ at which the board leaves the primary wave before point in time $b_2$ at which the board comes to contact with the secondary wave. The temperature of the board is the substantially same temperature as that of the solder material in the molten state in the solder bath such as about 250° C. for the period during which the board is in contact with the primary wave (i.e. the period between points in time $a_0$ and $b_1$) and for the period during which the board is in contact with the secondary wave (i.e. the period between points in time $b_2$ and $c_0$). For the period after the board leaves the primary wave and before the board comes to contact with the secondary wave (i.e. the period between points in time $b_1$ and $b_2$), the temperature of the board continues decreasing due to releasing its heat into a surrounding atmosphere of the board which atmosphere has a lower temperature and becomes the lowest in this period generally at a point in time immediately before the board comes to contact with the secondary wave (i.e. point in time $b_2$). In other words, the temperature of the board immediately before the board comes to contact with the secondary wave (i.e. point in time $b_2$) is maintained at or above 200° C. in this embodiment. It is possible to maintain the temperature of the board not less than 200° C., by making the distance $d_2$ between the primary wave and the secondary wave smaller than in the conventional case, for example changing the distance $d_2$ into about 60 mm or less, preferably about 30 to 50 mm and more preferably about 40 mm, or by supplying an amount of heat from the outside with hot air or the like. As stated above, the temperature decrease of the board after the board leaves the primary wave and before the board comes to contact with the secondary wave can be reduced, and the temperature of the board is maintained at or above 200° C. in this embodiment. Therefore, it is avoidable to form an unsatisfactory connection between the fillet of the solder material and the land.

Additionally, according to the conventional temperature profile which is generally used for the case of using the Sn—Pb based solder material, the temperature of the board is larger than about 200° C. even at a point in time which is 10 seconds later from the point in time at which the board leaves the secondary wave since the board is not positively cooled after the board leaves the secondary wave. When this is also applied to the case of using the lead-free solder material for soldering the electronic component onto the board, various problems may be encountered. For example, the "lift-off" which is a specific problem of the lead-free solder material may be caused more often, and the "crack" may occur.

According to this embodiment, on the other hand, the board is cooled such that the temperature of the board is in the range of 150° C.±30° C. (i.e. 120 to 180° C.) after 10 seconds later on the basis of the point in time at which the board leaves the secondary wave (i.e. at point in time $c_1$ which is 10 seconds later on the basis of the point in time $c_0$). It is possible to cool the temperature of the board to 120 to 180° C., for example, by contacting air and preferably cold air with the board by means of a nozzle, a fan and the like, or by spraying a liquid in the form of mist onto the board by means of an atomizer. By having the temperature of the board at or below 180° C. at the point in time which is 10 seconds later from the point in time at which the board leaves the secondary wave as described above, the occurrence ratio of the "lift-off" can be effectively reduced since segregation of a component which has a relatively low melting point among components of the lead-free solder material can be suppressed. On the other hand, by having the temperature of the board at or above 120° C. at the point in time which is 10 seconds later from the point in time at which the board leaves the secondary wave, the generation of the "crack" in the fillet resulting from rapid cooling may be avoidable.

As described above in detail, by controlling the temperature profile of the board as in this embodiment, it is possible to effectively reduce the various defects such as the occurrences of the "red eye" (or "insufficient rising" of the solder material), the "bridge", the "lift-off" and the "crack" which are encountered remarkably in the case of using the lead-free solder material.

Industrial Applicability

According to the present invention, there is provided flow soldering processes for mounting an electronic component onto a board by means of a solder material, which processes are appropriate for using the lead-free solder material as the solder material as well as apparatuses for conducting the processes. Those flow soldering processes and apparatuses make it to suppress a temperature decrease of the solder material supplied to the board (optionally a temperature decrease of the board itself) compared with the conventional case, and therefore occurrences of the "insufficient rising", the "bridge" and so on can be effectively reduced even though the lead-free solder material is used as a solder material.

The present application claims priorities under the Paris Convention to Japanese Patent Application Nos. 2000-292271 filed on Sep. 26, 2000 and No. 2000-299423 filed on Sep. 29, 2000 both of which are entitled "FLOW SOLDERING PROCESS AND APPARATUS". The contents of those applications are incorporated herein by the references thereto in their entireties.

What is claimed is:

1. A flow soldering process for mounting an electronic component onto a board with a solder material, the process comprising:

preheating the board by using a preheater located under the board, the board being provided with the electronic component and being conveyed; and supplying the solder material in its molten state to the board by successively contacting a lower surface of the board, which has previously been heated, with a primary wave of the solder material and a secondary wave of the solder material, wherein a temperature decrease of the board during a period after being previously heated and before contacting the primary wave is not larger than 3° C.

2. The flow soldering process according to claim 1, wherein a heating cover extending over the board is used for preheating the board.

3. The flow soldering process according to claim 1, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

4. The flow soldering process according to claim 1, wherein the temperature decrease is of a portion of the board, and the period is from a time point at which the portion of the board leaves the preheater for the primary wave to a time point at which the portion begins to contact the primary wave.

5. A flow soldering apparatus for mounting an electronic component onto a board with a solder material, the apparatus comprising:

a preheater located under the board which is provided with the electronic component and conveyed; and a solder material supplying unit for supplying a solder material, contained in a solder bath, to the board in a molten state by successively contacting a lower surface of the board with the solder material as a primary wave and a secondary wave, the solder material supplying unit being located downstream of the preheater in a direction of conveyance of the board and being constructed to set a width of a gap between the preheater and the solder bath within 20 to 60 mm.

6. The apparatus according to claim 5, further comprising a closing device for closing the gap between the preheater and the solder bath so as to prevent a gas stream from passing through the gap.

7. The apparatus according to claim 5, further comprising a heating cover located above the preheater so as to extend over the board.

8. The apparatus according to claim 5, wherein the solder material is a lead-free solder material selected from the group consisting of an Sn—Cu based material, an Sn—Ag—Cu based material, an Sn—Ag based material, an Sn—Ag—Bi based material and an Sn—Ag—Bi—Cu based material.

* * * * *